(12) United States Patent
Miller

(10) Patent No.: US 6,700,943 B1
(45) Date of Patent: *Mar. 2, 2004

(54) DIGITAL BIT SYNCHRONIZER FOR LOW TRANSITION DENSITIES

(75) Inventor: Curtis G. Miller, Long Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/540,176

(22) Filed: Mar. 31, 2000

Related U.S. Application Data

(63) Continuation-in-part of application No. 09/376,936, filed on Aug. 18, 1999.

(51) Int. Cl.$^7$ .................................................. H04L 7/00
(52) U.S. Cl. ..................... 375/354; 375/362; 375/326; 370/503
(58) Field of Search ................................ 375/354, 326, 375/362; 370/503

(56) References Cited

U.S. PATENT DOCUMENTS

| 4,756,011 | A | * | 7/1988 | Cordell | 375/371 |
| 5,111,486 | A | * | 5/1992 | Oliboni et al. | 375/376 |
| 6,137,850 | A | * | 10/2000 | Miller | 375/354 |

* cited by examiner

*Primary Examiner*—Stephen Chin
*Assistant Examiner*—Guillermo Muñoz
(74) *Attorney, Agent, or Firm*—Marshall, Gerstein & Borun LLP

(57) ABSTRACT

An apparatus and method for synchronizing a derived bit clock with a transmit bit clock of a transmitted data signal is disclosed. The present invention uses a divide-only direct digital synthesizer and a fixed local oscillator. The synthesizer generates a derived bit clock by dividing the fixed, high frequency local oscillator. A transition detector identifies valid bit transitions in the unsynchronized data signal. At each valid transition, a control algorithm determines whether to adjust the frequency and/or phase of the derived data clock in order to maintain synchronization between the derived bit clock and the transmit bit clock. The unsynchronized data signal and the derived bit clock are processed by a reclock latch to generate a synchronized data signal.

28 Claims, 13 Drawing Sheets

DIGITAL BIT SYNCHRONIZER FOR LOW TRANSITION DENSITIES

RELATED APPLICATIONS

This is a continuation-in-part of U.S. patent application Ser. No. 09/376,936, which was filed Aug. 18, 1999.

BACKGROUND OF THE INVENTION (a) Field of the Invention

The present invention relates generally to bit recovery in a digital communication system and, more particularly, to an apparatus for bit synchronization.

(b) Description of Related Art

In digital communication systems, a transmitter transmits digital signals that represent digital symbols. The digital signals are transmitted synchronously with a transmit symbol clock, which has a frequency and a phase. A receiver receives the transmitted signal, containing the transmitted digital symbols as well as noise. In order to determine the values of the transmitted symbols with minimum errors, the receiver must know the frequency and phase of the transmit symbol clock. Most receivers derive the frequency and phase of the transmit symbol clock from the transmitted signal itself, thereby creating a derived symbol clock. Receivers derive the frequency and phase of the transmit symbol clock from the transmitted signal using a classical analog phase-locked loop (PLL). The classical analog PLL evaluates the transmitted signal in the frequency domain to derive the frequency and phase of the transmit symbol clock.

When transmitting non-return-to-zero (NRZ) data, the transmit symbol clock frequency and phase are derivable only from the instances when a symbol transitions to a symbol of a different value. This creates a problem in that a sequence of identical symbols contains no information that may be used to derive the frequency and phase of the transmit symbol clock. Because the analog PLL evaluates the transmitted signal in the frequency domain, the transmit symbol clock of NRZ data with no symbol transitions appears to the analog PLL to have a frequency of zero.

Another problem occurs with receivers using analog PLLs when transmitting NRZ data with low transition densities, i.e. data containing long sequences of symbols of the same value. Because of the low transition densities, the frequency of the transmit symbol clock appears to be lower than it actually is. Therefore, during periods when the transmitted NRZ data contains few transitions, the derived symbol clock will drift in frequency and phase from the transmit symbol clock. Symbol clock drift results in increased symbol error rates and reduced efficiency of the communication system.

Currently, the problem of derived symbol clock drift due to low transition densities is overcome by transmitting data using a return-to-zero (RZ) symbol scheme, such as a Manchester Code, which results in a transition for each symbol. RZ symbol schemes guarantee adequate symbol clock components in the data signal from which to derive the symbol clock frequency and phase. However, as is well known in the art, using a Manchester Code effectively doubles the required transmission bandwidth and requires a doubling of transmission power to maintain the same error rate.

Another existing solution for symbol clock drift due to low transmission densities artificially creates symbol transitions by encoding the data before transmission, using, for example, an encryption technique. However, the complexity of the communication system is increased because of the additional steps of encoding the data prior to transmission, as well as decoding the data subsequent to receiving the data.

The use of the analog PLL in digital communication systems involves additional shortcomings. For instance, cost is increased because a high quality voltage controlled oscillator is often required in order to achieve acceptable symbol error rates. Additionally, the analog PLL is more sensitive to temperature changes than digital components. Moreover, the use of an analog PLL requires interfacing of analog and digital components, resulting in increased complexity, size, weight, and cost.

The present invention overcomes the problem of derived symbol clock drift caused by transmission of NRZ data with low transition densities. Additionally, the present invention utilizes digital circuitry instead of an analog PLL, thereby overcoming the above mentioned problems related to analog PLLs.

SUMMARY OF THE INVENTION

The present invention is embodied in a bit recovery subsystem for synchronizing a received digital signal with a transmitted digital signal. The bit recovery subsystem includes a demodulator that receives an RF signal encoded with digital information representative of a transmit bit clock and producing a baseband signal, voltage comparators that process the baseband signal to produce two digital logic signals and a latch that converts the two digital logic signals into unsynchronized data and inverted unsynchronized data. The bit recovery subsystem also includes a bit synchronizer that processes the unsynchronized data and inverted unsynchronized data to produce a derived bit clock and a reclock latch that processes the unsynchronized data and the derived bit clock delayed by a phase to produce synchronized data.

The present invention may also be embodied in a method of synchronizing a received digital signal with a transmitted digital signal. The method includes the steps of receiving an RF signal encoded with digital information representative of a transmit bit clock and producing a baseband signal, processing the baseband signal to produce two digital logic signals, and converting the two digital logic signals into unsynchronized data and inverted unsynchronized data. The method also includes the steps of processing the unsynchronized data and inverted unsynchronized data to produce a derived bit clock and processing the unsynchronized data and the derived bit clock to produce synchronized data.

The invention itself, together with further objects and attendant advantages, will best be understood by reference to the following detailed description, taken in conjunction with the accompanying drawings.

DESCRIPTION OF THE PREFERRED EMBODIMENTS

The present invention is an apparatus and method for synchronizing a derived bit clock with a transmit bit clock of a transmitted data signal. The present invention synchronizes the derived bit clock with the transmit bit clock by evaluating, in the time domain, bit transitions and bit states of the transmitted data signal. Although the disclosed embodiment relates to a digital communication system employing two data symbols (0 and 1), it would be straightforward to extend the present invention to communication systems employing greater than two data symbols. The present invention avoids the use of a classical analog PLL, instead employing a divide-only direct digital synthesizer. The synthesizer generates a derived bit clock by dividing a fixed, high frequency local oscillator. A transition detector identifies valid bit transitions in the data signal. At each valid transition, a control algorithm determines whether to adjust the frequency and/or phase of the derived data clock in order to maintain synchronization between the derived bit clock and the transmit bit clock.

Figure 1:
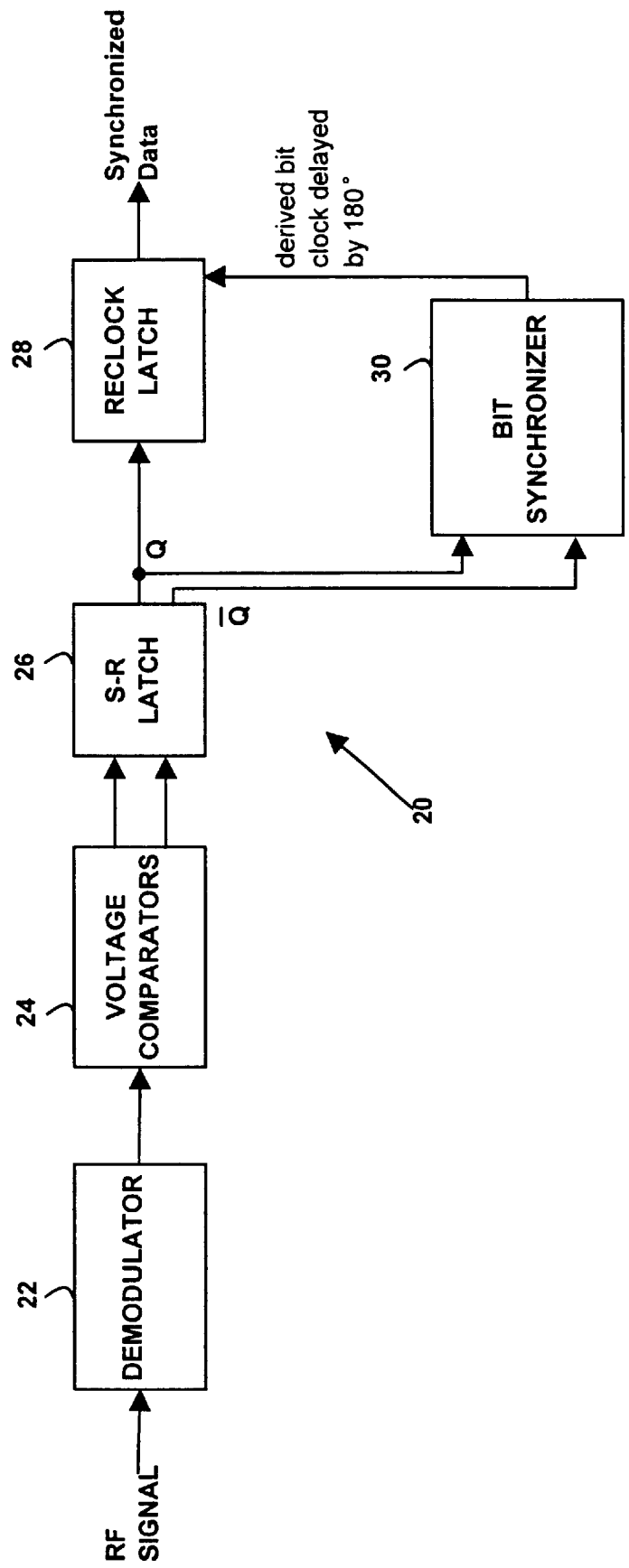
FIG. 1 is a block diagram of bit recovery subsystem embodying the present invention.

FIG. 1 illustrates a bit recovery subsystem 20 embodying the present invention in a radio frequency (RF) receiver. The bit recovery subsystem 20 includes a demodulator 22, voltage comparators 24, an S-R latch 26, a reclock latch 28, and a bit synchronizer 30. The demodulator 22 demodulates an RF signal that contains data to produce a baseband signal. The demodulator 22 provides the baseband signal to the voltage comparators 24. The voltage comparators 24 compare the baseband signal to a reference signal, and produce a first two-level signal corresponding to a logic 0 or a logic 1. The voltage comparators 24 similarly produce a second two-level signal that is substantially the logical inverse of the first two-level signal. The first and second two-level signals contain transitions due to the data changing states (valid transitions) and transitions due to noise and interference (invalid transitions). The voltage comparators 24 provide the first and second two-level signals to the set-reset (S-R) latch 26. The S-R latch 26 latches the first and second two-level signals. The S-R latch 26 is used because it does not respond to "high" inputs on both the set and reset inputs and outputs a "high" on both outputs when both inputs are "low." Accordingly, two "high" inputs to the S-R latch 26 will not cause an output from the S-R latch 26, which protects against comparator trigger threshold differences. Additionally, the comparator response time acts as a low-pass filter that removes high frequency noise, which may trigger subsequent logic gates. The S-R latch 26 generates an unsynchronized data signal and an inverted unsynchronized data signal referred to as Q and $\bar{Q}$, respectively. The unsynchronized data signal is provided to the reclock latch 28 and the bit synchronizer 30. The unsynchronized and inverted ansynchronized data signals are provided to the bit synchronizer 30. The bit synchronizer 30 generally produces a derived bit clock from the unsynchronized and the inverted unsynchronized data signals. The derived bit clock, delayed by 180 degrees, is provided to the reclock latch 28. The reclock latch 28 uses the derived bit clock to latch the unsynchronized data signal, thereby producing a synchronized data signal.

Figure 2:
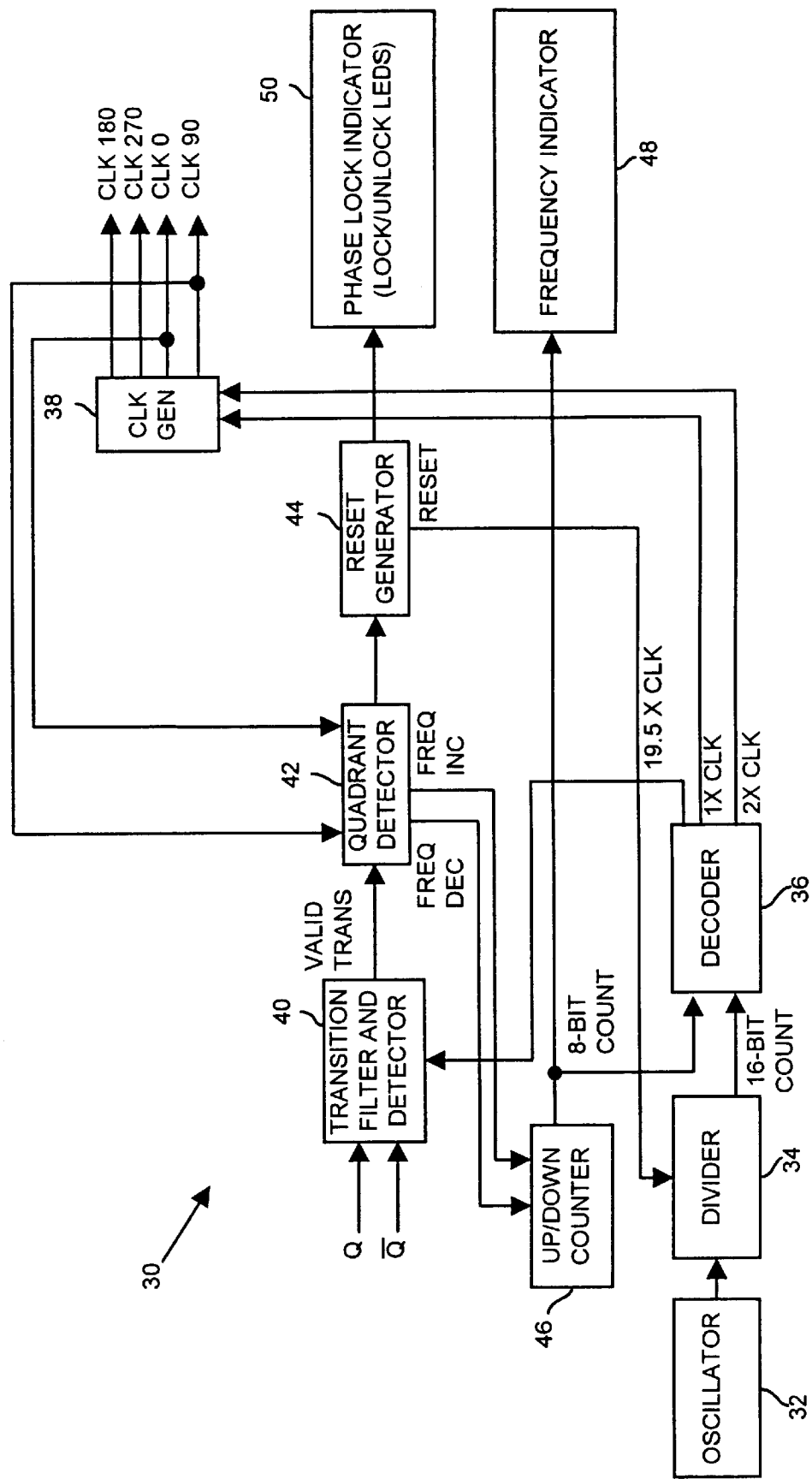
FIG. 2 is a detailed block diagram of the bit synchronizer shown in FIG. 1

As shown in FIG. 2, the bit synchronizer 30 generally includes an oscillator 32, a divider 34, a decoder 36, a clock generator 38, a transition filter and detector 40, a quadrant detector 42, a reset generator 44, an up/down counter 46, a frequency indicator 48, and a phase lock indicator 50. The oscillator 32 generates an output signal that is a periodic and has a fixed frequency. The divider 34 generally receives the oscillator output signal and a RESET signal from the reset generator 44, and produces a 16-bit count signal. The 16-bit count signal of the divider 34 is provided to the decoder 36 and the up/down counter 46. The decoder 36 generally receives the 16-bit count signal and an 8-bit count signal from the up/down counter 46, and produces a 19.5×CLK signal, a 1×CLK signal, and a 2×CLK signal. The 19.5×CLK signal is provided to the transition filter and detector 40. The 1×CLK and 2×CLK signals are provided to the clock generator 38. The clock generator 38 generally receives the 1×CLK and 2×CLK signals and generates CLK 0, CLK 90, a CLK 180, and CLK 270 signals. The CLK 0 signal is the derived bit clock, and the CLK 90, CLK 180 and CLK 270 signals are the derived bit clock, delayed by 90°,180° and 270°, respectively. The CLK 0 and CLK 90 signals are provided to the quadrant detector 42. The CLK 180 signal is provided to the reclock latch 28 (See FIG. 1).

The unsynchronized and the inverted unsynchronized data signals, from the S-R latch 26 (See FIG. 1), are provided to the transition filter and detector 40. The transition filter and detector 40 generally produces a VALID TRANS signal that substantially corresponds to valid data transitions in the unsynchronized data signal. The quadrant detector 42 receives the VALID TRANS signal from the transition filter and detector 40, as well as the CLK 0 and CLK 90 signals from the clock generator 38. The quadrant detector 42 generates a FREQ INC signal and a FREQ DEC signal that are provided to the up/down counter 46. Additionally, the quadrant detector 42 generally generates an OUT PHASE signal and an IN PHASE signal that are provided to the reset generator 44.

Generally, the reset generator 44 receives the OUT PHASE and IN PHASE signals from the quadrant detector 42 and generates an UNLOCK signal, a LOCK signal, and the RESET signal. The RESET signal is provided to the divider 34. The LOCK and UNLOCK signals are provided to the phase lock indicator 50. The up/down counter 46 generally receives the FREQ INC and FREQ DEC signals from the quadrant detector 42, as well as the 16-bit count signal, and produces the 8-bit count signal. The 8-bit count signal is provided to the decoder 36 and the frequency indicator 48. The frequency indicator 48 generally receives the 8-bit count signal and visually displays the frequency at which the derived bit clock is oscillating.

The oscillator 32 oscillates at a fixed rate that is nominally an integer multiple of the transmit bit clock rate. In one embodiment, the integer multiple of the oscillator 32 is 40,000 times the transmit bit clock rate. Thus, for a transmit bit clock rate of 1 kHz, the fixed rate of the oscillator 32 is 40 MHZ. As will be explained below, a different integer multiple of the transmit bit clock rate for the oscillator 32 may be chosen depending upon the requirements of a particular application.

Figure 3:
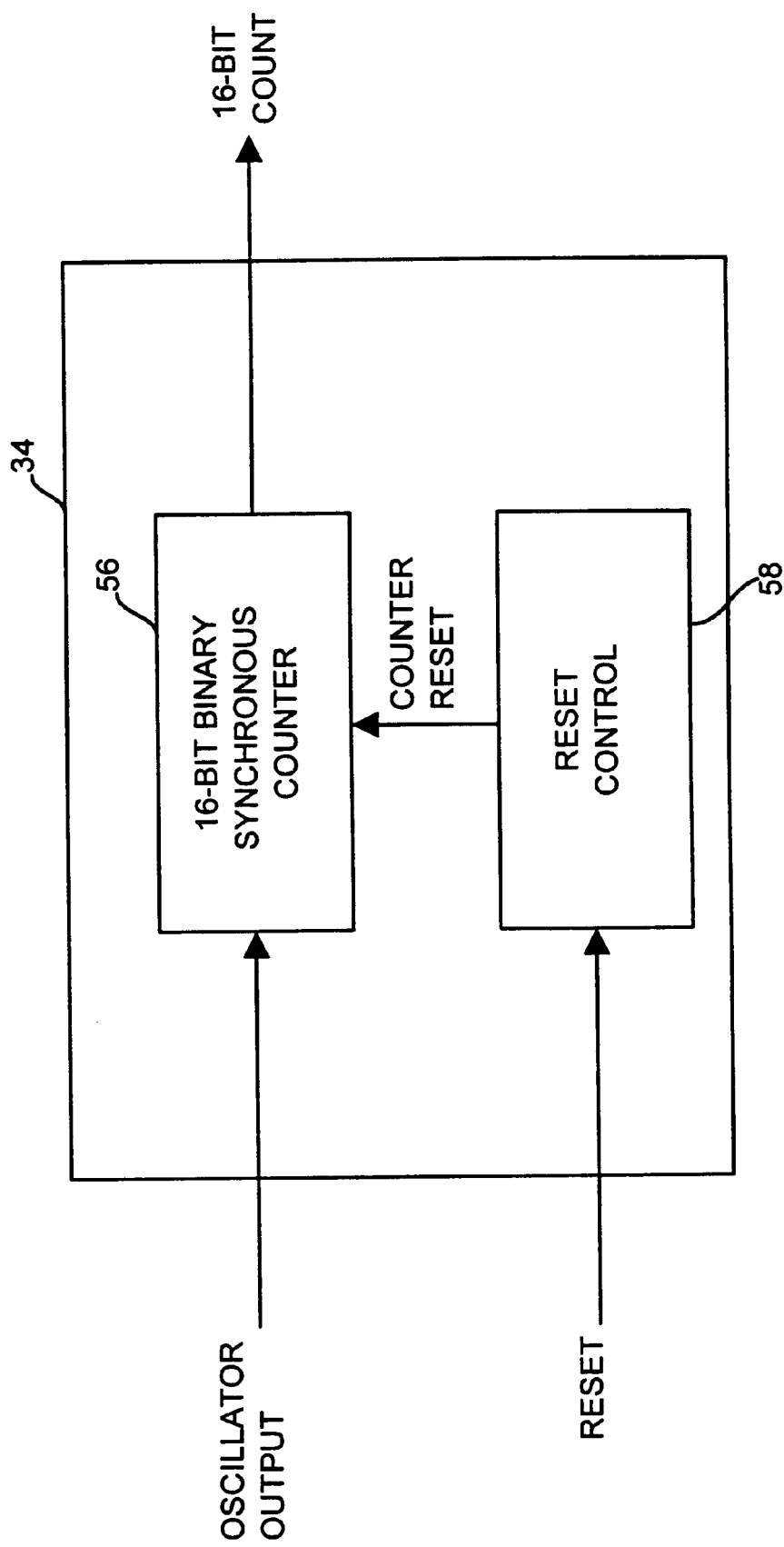
FIG. 3 is a detailed block diagram of the divider shown in FIG. 2.

FIG. 3 illustrates a preferred embodiment of the divider 34. The divider 34 generally is a counter that counts to a fixed value. More specifically, the divider 34 receives the oscillator output signal and the RESET signal, and generates the 16-bit count signal. The divider 34 is comprised of a 16-bit binary synchronous counter 56, hereinafter referred to as the 16-bit counter 56, and a reset control 58. The 16-bit counter 56 receives the oscillator output signal and a COUNTER RESET signal, and produces the 16-bit count signal, ranging in value from 0 to 65,536. In operation, the oscillator output signal continuously increments the 16-bit counter 56. The COUNTER RESET signal resets the 16-bit counter 56 to all zeros. The 16-bit count signal is supplied to the decoder 36.

The reset control 58 generally resets the 16-bit counter 56 to all zeros. More specifically, the reset control 58 receives the RESET signal, and produces the COUNTER RESET signal. The reset control 58 resets the 16-bit counter 56 upon the occurrence of a negative pulse on the RESET signal.

Figure 4:
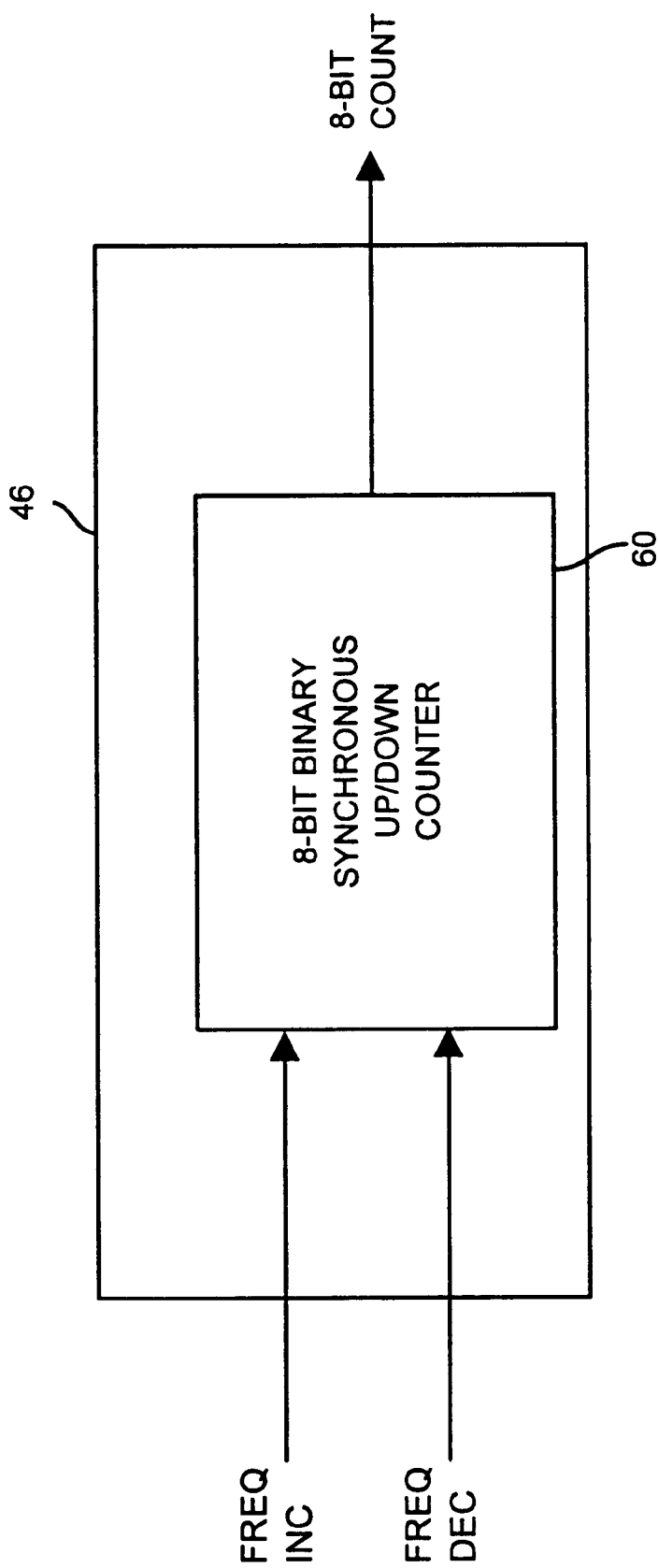
FIG. 4 is a detailed block diagram of a first embodiment of the up/down counter shown in FIG. 2.

FIG. 4 illustrates a first embodiment of the up/down counter 46. The up/down counter 46 generally controls the frequency of the derived bit clock. More specifically, the up/down counter 46 receives the FREQ DEC and FREQ INC signals, and produces the 8-bit count signal ranging in value from −64 to +63. The first embodiment of the up/down counter 46 does not employ the 16-bit count signal. The up/down counter 46 comprises an 8-bit binary synchronous up/down counter 60, hereinafter referred to as the 8-bit counter 60. The 8-bit counter 60 increments by one count when a negative pulse occurs on the FREQ INC signal, and decrements by one count when a negative pulse occurs on the FREQ DEC signal. The 8-bit counter 60 will not increment above a maximum count and will not decrement below a minimum count. As will be discussed below, a larger or smaller binary synchronous up/down counter, providing a larger or smaller range of values, respectively, may be used in place of the 8-bit counter 60 depending upon the particular application. The output of the 8-bit counter 60 is the 8-bit count signal, and is supplied to the decoder 36 and the frequency indicator 48.

Figure 5:
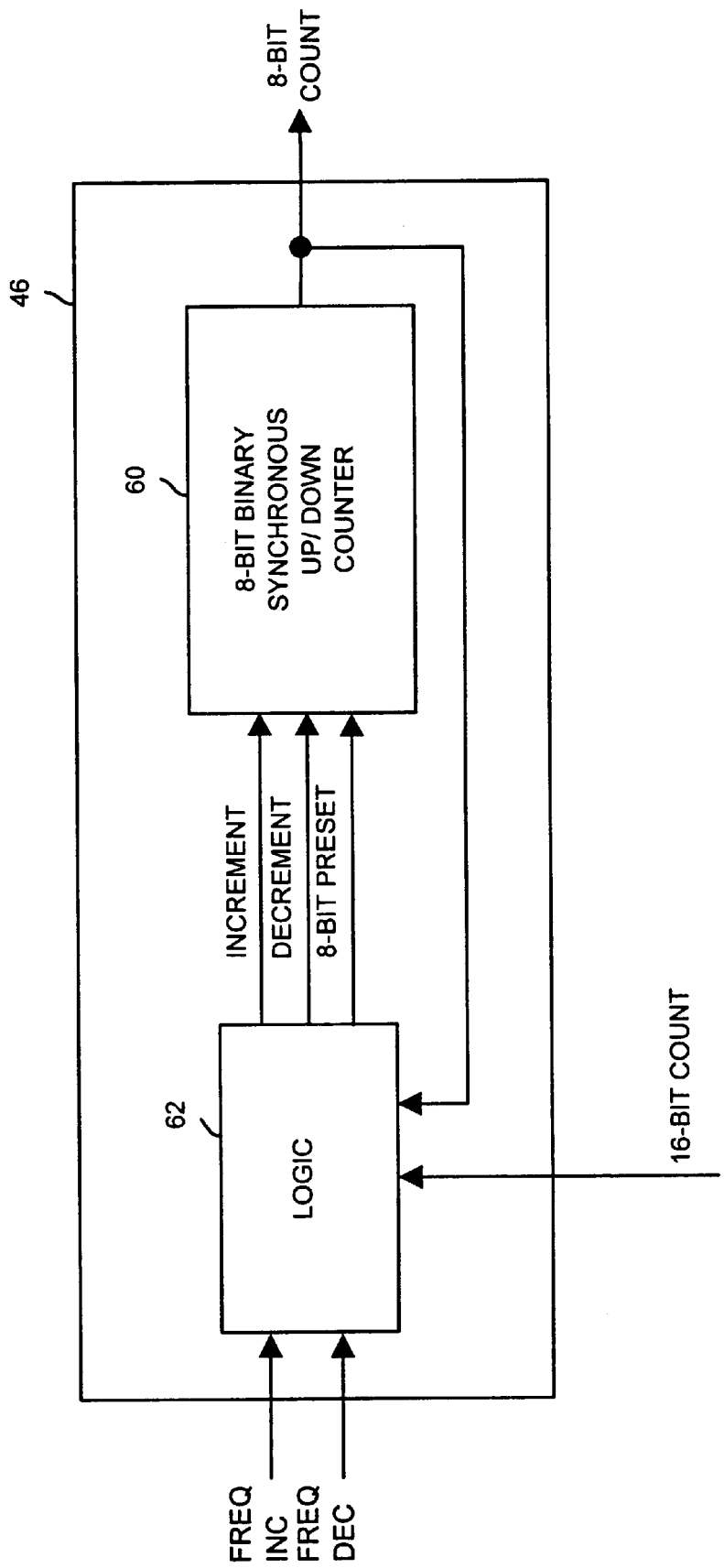
FIG. 5 is a detailed block diagram of an alternate embodiment of the up/down counter shown in FIG. 2.

An alternative embodiment of the up/down counter 46 is illustrated in FIG. 5. The alternative embodiment of the up/down counter 46 comprises the 8-bit counter 60 and logic 62. Similar to the first embodiment, the 8-bit counter 60 receives an increment signal and a decrement signal to increment or decrement, respectively, the 8-bit counter 60 by one count. The 8-bit counter additionally receives an 8-bit preset signal to preset the 8-bit counter 60 to a preset value. The logic 62 generally changes the value of the 8-bit counter 60 more rapidly than in the first embodiment. As will be discussed below, the logic 62 may be used to achieve a faster slew rate or to accommodate a wider data bandwidth. The logic 62 receives the FREQ INC, FREQ DEC, 16-bit count, and 8-bit count signals. The logic 62 generates an increment signal, a decrement signal, and an 8-bit preset signal. The logic 62 may be tailored to change the count of the 8-bit counter 60 to fit a particular application. For example, the logic 62 may be designed to generate two negative pulses on the increment signal or decrement signal for every single negative pulse on the FREQ INC signal or FREQ DEC signal, respectively. Additionally, the logic 62 may be designed to change the value of the 8-bit count signal by more than one count by presetting a new count value.

Figure 6:
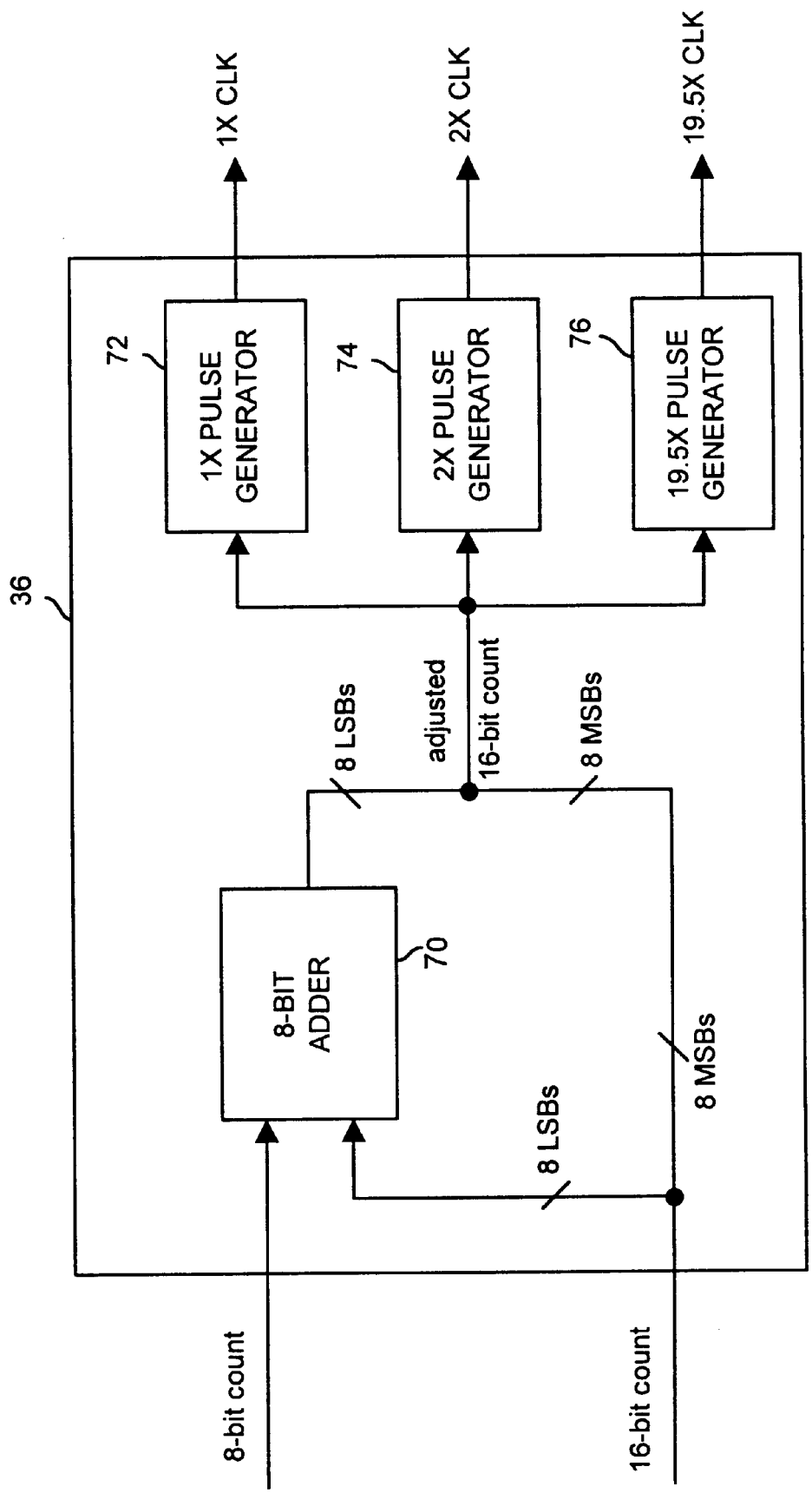
FIG. 6 is a detailed block diagram of an alternate embodiment of the decoder shown in FIG. 2.

FIG. 6 illustrates a preferred embodiment of the decoder 36. Generally, the decoder receives the 8-bit count and the 16-bit count and generates the 1×CLK, 2×CLK, and 19.5× CLK signals. The decoder 36 includes an 8-bit adder 70, a 1×pulse generator 72, a 2×pulse generator 74, and a 19.5× pulse generator 76. The 8-bit adder 70 generally adds the 8-bit count signal with the 8 least significant bits (8 LSBs) of the 16-bit count signal, thereby generating an output. The output of the 8-bit adder 70 and the 8 most significant bits (8 MSBs) of the 16-bit count signal are combined to form an adjusted 16-bit count signal, wherein the output of the 8-bit adder 70 forms the 8 LSBs of the adjusted 16-bit count, and the 8 MSBs of the 16-bit count form the 8 MSBs of the adjusted 16-bit count. The adjusted 16-bit count is supplied to the 1×pulse generator 72, the 2×pulse generator 74, and the 19.5×pulse generator 76.

The 1×pulse generator 72 generally produces the 1×CLK signal. More specifically, the 1×pulse generator 72 receives the adjusted 16-bit count and generates a negative pulse when the adjusted 16-bit count reaches a full-count value. In the present embodiment, the full-count value is 40,000, which corresponds to the integer multiple of the transmit bit clock rate at which the oscillator 32 (See FIG. 1) oscillates. Alternatively, the full-count value may be programmable, so that the bit synchronizer may support multiple transmit data rates.

The 2×pulse generator 74 generally produces the 2×CLK signal. More specifically, the 2×CLK signal uses periodic negative pulses, wherein the periodic negative pulses occur at substantially double the rate of, and substantially in phase with, the pulses occurring on the 1×CLK signal. More specifically, the 2×pulse generator 74 receives the adjusted 16-bit count and generates the 2×CLK signal in a manner well known in the art.

The 19.5×pulse generator 76 generally produces the 19.5× CLK signal. More specifically, the 19.5×CLK signal comprises periodic negative pulses, wherein the periodic negative pulses occur at substantially 19.5 times the rate of, and substantially in phase with, the pulses occurring on the 1×CLK signal. More specifically, the 19.5×pulse generator 76 receives the adjusted 16-bit count and generates the 19.5×CLK signal in a manner well known in the art.

Referring again to FIG. 2; the clock generator 38 generally produces four phases of the derived bit clock. More, specifically, the clock generator 38 receives the 1×CLK and 2×CLK signals, and produces the CLK 0 signal, wherein the CLK 0 signal is the derived bit clock, and wherein the CLK 0 signal is substantially a 50% duty cycle periodic signal. Moreover, the clock generator 38 generates the CLK 90 signal, which is the CLK 0 signal delayed by 90°, the CLK 180 signal, which is the CLK 0 signal delayed by 180°, and the CLK 270 signal, which is the CLK 0 signal delayed by 270° degrees. The CLK 0, CLK 90, CLK 180, and CLK 270 signals are produced in manner well known in the art. The CLK 180 signal is provided to the reclock latch 28 (See FIG. 1). The CLK 0 and CLK 90 signals are provided to the quadrant detector 42. The four phases of the derived bit clock are generated in order to simplify code conversion from the transmitted NRZ code to another code, such as a Manchester code.

Figure 7:
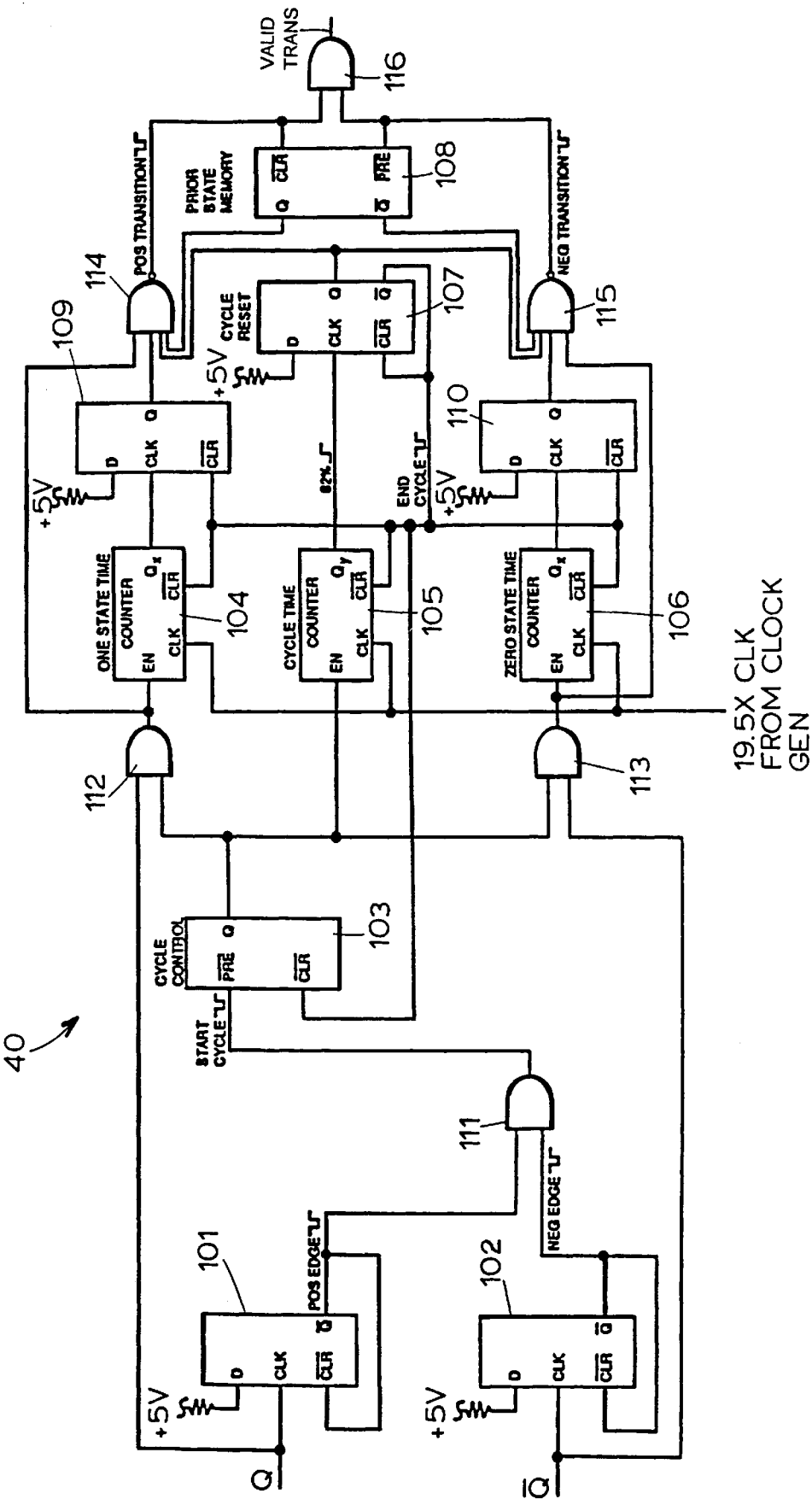
FIG. 7 is a detailed block diagram of the transition filter and detector shown in FIG. 2.

FIG. 7 illustrates a preferred embodiment of the transition filter and detector 40, which generally detects valid transitions in the unsynchronized data signal and determines a new data state. Generally, the transition filter and detector 40 detects a transition from a first state to a second state in the unsynchronized data signal and then applies three criteria in order to determine whether the detected transition was a valid transition. If all three criteria are satisfied, the transition filter and detector 40 produces a pulse on the VALID TRANS line. Additionally, the transition filter and detector 40 stores the new data state.

A first criteria for operation is that the unsynchronized data must be in the second state at a period of time subsequent to the detected transition. The period of time chosen in the present invention is 82% of the derived bit clock period, which will be more fully explained below. A second criteria for operation is that the unsynchronized data must remain in the second state, subsequent to the detected transition, for at least an aggregate period of time. The aggregate period of time in the present invention is 62% of the derived bit clock period, which will be more fully explained below. A third criteria for operation is that the second state must be different than the stored data state.

The first and second operation criteria are generally designed to filter out pulses in the unsynchronized data signal which are of a width less than the derived bit clock period. The 82% of the derived bit clock period time period was chosen based upon a typical bit width at a 90% amplitude point, an allowance for a clock used by the transition filter and detector 40 not being in time coincidence with the detected transition, and allowance for 10% edge jitter in the transmitted data. The 62% of the derived bit clock period aggregate time period corresponds to 75% of the 82% of the bit clock period time period. The 62% of the derived bit clock period aggregate time period was chosen based upon typical rise and fall times, an allowance for a clock used by the transition filter and detector 40 not being in time coincidence with the detected transition, and allowance for 10% edge jitter in the transmitted data. The time periods in the first and second criteria may be adjusted as required for a particular application.

The third criteria for operation is generally designed to reject additional invalid transitions in the unsynchronized data signal. A valid transition occurs when the data changes from a previous state to a new state which is different than the previous state. Therefore, the third criteria is designed to ignore transitions wherein the second state is the same as the stored state.

Referring again to FIG. 7 the transition filter and detector 40 generally detects transitions in the unsynchronized data signal. When a transition is detected, the transition filter and detector 40 begins a cycle, wherein the three criteria discussed above are applied. During the cycle, subsequent transitions in the unsynchronized data are generally ignored. The cycle ends after a time period of approximately 82% of the bit clock period. At the end of the cycle, if all the three criteria are met, the transition filter and detector 40 generates a negative pulse on the VALID TRANS signal and stores the new data state.

The preferred embodiment of the transition filter and detector 40 generally includes a positive edge detector 101, a negative edge detector 102, a cycle control latch 103, a one-state time counter 104, a cycle time counter 105, a zero-state time counter 106, a cycle reset flip flop 107, a prior state memory 108, a one-state time latch 109, a zero-state time latch 110, an edge detect gate 111, a one-state gate 112, a zero-state gate 113, a positive transition gate 114, a negative transition gate 115, and a valid transition gate 116.

The positive edge detector 101 and the negative edge detector 102 generally detect positive going edges in the unsynchronized data signal and the inverted unsynchronized data signal, respectively, and produce a POS EDGE signal and a NEG EDGE signal, respectively. The positive edge detector 101 and the negative edge detector 102 generally are D flip flops, with their D inputs tied to logic 1, their inverted outputs are fed to their clear inputs, respectively, and clocked by the unsynchronized data signal and inverted unsynchronized data signal, respectively. When flip flops 101 and 102 detect positive edges, they produce negative pulses on the POS EDGE signal, and the NEG EDGE signal, respectively.

The POS EDGE and NEG EDGE signals are provided to the edge detect gate 111, which generally produces a START CYCLE signal. The edge detect gate generally is a two-input AND gate, with its inputs being the POS EDGE and NEG EDGE signals, and its output being the START CYCLE signal. Generally, the edge detect gate 111 combines negative pulses on the POS EDGE and NEG EDGE signals onto the START CYCLE signal. The START CYCLE signal is provided to the cycle control latch 103.

Generally, the cycle control latch 103 starts and stops the cycle by producing the CYCLE ON signal. The cycle control latch 103 generally is a preset/clear flip flop, with its preset signal tied to the START CYCLE signal, its clear signal tied to an END CYCLE signal, and its output being the CYCLE ON signal. If a cycle has not yet started, a negative pulse on the START CYCLE signal will cause the CYCLE ON signal to go high, causing a cycle to commence. If a cycle has already started, the CYCLE ON signal is already high, and a negative pulse on the START CYCLE signal will have no effect. If the END CYCLE signal goes low, the cycle control latch 103 is cleared, and the CYCLE ON signal will go low. The CYCLE ON signal is provided to the cycle time counter 105, the one-state gate 112, and the zero-state gate 113.

Generally, the one-state gate 112, produces an output which goes high only if the CYCLE ON signal is high and the unsynchronized data signal is high. The one-state gate 112 is a two-input AND gate. Its inputs are the CYCLE ON signal and the unsynchronized data signal. The output of the one-state gate 112 is supplied to the one-state time counter 104 and the positive transition gate 114.

Generally, the zero-state gate 113, produces an output that goes high only if the CYCLE ON signal is high and the inverted unsynchronized data signal is high. The zero-state gate 113 is a two-input AND gate. Its inputs are the CYCLE ON signal and the inverted unsynchronized data signal. The output of the zero-state gate 113 is supplied to the zero-state time counter 106 and the negative transition gate 115.

The cycle time counter 105 is used to measure the first criteria, i.e. the 82% of bit clock period time period. The cycle time counter 105 receives the CYCLE ON signal, the END CYCLE signal, and the 19.5×CLK, and produces an output. Generally, the cycle time counter 105 is a counter clocked by the 19.5×CLK signal, enabled by the CYCLE ON signal, and cleared by the END CYCLE signal. When the cycle time counter 105 is enabled by the CYCLE ON signal, it counts to a value of 16. When the cycle time counter 105 reaches the count 16, its output goes high. Because the 19.5×CLK is at a frequency 19.5 times that of the derived bit clock, it takes approximately 82% of the bit clock period for the output of the cycle timeout counter 105 to go high (16/19.5=0.821). When the END CYCLE signal goes low, the cycle time counter 105 is cleared. The output of the cycle time counter 105 is supplied to the cycle reset flip flop 107.

The cycle reset flip flop 107 generally produces an output that indicates whether the first criteria has been satisfied. Additionally, the cycle reset flip flop 107 resets the transition filter and detector 40 at the end of the cycle. More specifically, the cycle reset flip flop 107 receives the output of the cycle time counter 105, and generates a negative pulse on the END CYCLE signal, as well as a positive pulse on a TEST signal. Generally, the cycle reset flip flop 107 is a D flip flop. A D input is tied to logic high, a CLK input is connected to the output of the cycle time counter 105, and a clear input is connected to the END CYCLE signal. The END CYCLE signal is generated from the inverted output of the cycle reset flip flop 107, and the TEST signal is generated by the output of the cycle reset flip flop 107. When the output of the cycle time counter 105 goes high, the cycle reset flip flop 107 causes the END CYCLE signal to go low, and causes the TEST signal to go high. When END CYCLE goes low, the cycle reset flip flop 107 is cleared, and the END CYCLE signal subsequently goes high. Additionally, the TEST signal subsequently goes low. The END CYCLE signal is supplied to the cycle control latch 1.03, the one-state time counter 104, the cycle time counter 105, the zero-state time counter 106, the one-state time latch 109, and the zero-state time latch 110. The TEST signal is supplied to the positive transition gate 114 and the negative transition gate 115.

The one-state time counter 104 generally measures the aggregate amount of time, during a cycle, that the unsynchronized data signal is in the one-state. This measurement is required for the second criteria, i.e. the 62% of derived bit clock period time period, for a transition from zero-state to one-state. Generally, the one state time counter 104 receives the output of the one-state gate 112, the 19.5×CLK signal, and the END CYCLE signal, and produces an output signal. The one state time counter 104 is a counter, with its enable input connected to the output of the one-state gate 112, its clock input connected to the 19.5×CLK signal, and its clear input connected to the END CYCLE signal. The output of the one-state time counter 104 goes high when a specified count is reached. The specified count of the one-state time counter 104 is 12, and will be more fully explained below. The one-state time counter 104 counts to a value of 12, clocked by the 19.5×CLK signal. However, the one-state time counter 104 only counts when the output of the one-state gate 112 is high. When the one state time counter 104 reaches the count 12, its output goes high. Because the 19.5×CLK signal is at a frequency 19.5 times that of the derived bit. clock, it takes, in the aggregate, approximately 62% of the derived bit clock period for the output of the one state time counter 104 to go high (12/19.5=0.615). When the END CYCLE signal goes low, the one-state time counter 104 is cleared. The output of the one-state time counter 104 is supplied to the one-state time latch 109.

The one-state time latch 109 generally produces an output which indicates whether the second criteria has been met. More specifically, the one-state time latch 109 receives the output from the one-state time counter 104 and the END CYCLE signal, and produces an output signal. The one-state time latch 109 is a D flip flop, with its D input connected to logic high, its clock input connected to the output of the one-state time counter 104, and its clear input connected to the END CYCLE signal. If the output of the one-state time counter 104 goes high, the output of the one-state time latch 109 will go high. The output of the one-state time latch 109 will remain high until the one-state time latch 109 is cleared by the END CYCLE signal. The output of the one-state time latch 109 is supplied to the positive transition gate 114.

The positive transition gate 114 generally produces an output which indicates whether the first, second, and third criteria have been met in the case of a transition from zero to one. More specifically, the positive transition gate 114 receives signals from the output of the one-state gate 112, the output of the one-state time latch 109, the TEST signal, and an output from the prior state memory 108. The positive transition gate 114 is a four-input NAND gate. Satisfaction of the first criteria is tested with the output of the one-state gate 112 as well as the TEST signal. Satisfaction of the second criteria is tested with the output of one-state time latch 109 as well as the TEST signal. Satisfaction of the third criteria is tested with the output of the prior state memory 108. If all the input signals to the positive transition gate 114 are high, this indicates that all three criteria are satisfied, and the output of the positive transition gate 114 will go low. The output of the positive transition gate 114 is provided to the valid transition gate 116 and the prior state memory 108.

The zero-state time counter 106 generally measures the aggregate amount of time, during a cycle, that the unsynchronized data signal is in the zero-state. This measurement is required for the second criteria, i.e. the 62% of derived bit clock period time period, for a transition from one-state to zero-state. Generally, the zero state time counter 106 receives the output of the zero-state gate 113, the 19.5×CLK signal, and the END CYCLE signal, and produces an output signal. The zero state time counter 106 is a counter, with its enable input connected to the output of the zero-state gate 113, its clock input connected to the 19.5×CLK signal, and its clear input connected to the END CYCLE signal. The output of the zero-state time counter 106 goes high when a specified count is reached. The specified count of the zero-state time counter 106 is 12, and will be more fully explained below. The zero-state time counter 106 counts to a value of 12, clocked by the 19.5×CLK signal. However, the zero-state time counter 106 only counts when the output of the zero-state gate 113 is high. When the zero state time counter 106 reaches the count 12, its output goes high. Because the 19.5×CLK signal is at a frequency 19.5 times that of the derived bit clock, it takes, in the aggregate, approximately 62% of the derived bit clock period for the output of the zero state time counter 106 to go high (12/19.5=0.615). When the END CYCLE signal goes low, the zero-state time counter 106 is cleared. The output of the zero-state time counter 106 is supplied to the zero-state time latch 110.

The zero-state time latch 110 generally produces an output which indicates whether the second criteria has been met. More specifically, the zero-state time latch 110 receives the output from the zero-state time counter 106 and the END CYCLE signal, and produces an output signal. The zero-state time latch 110 is a D flip flop, with its D input connected to logic high, its clock input connected to the output of the zero-state time counter 106, and its clear input connected to the END CYCLE signal. If the output of the zero-state time counter 106 goes high, the output of the zero-state time latch 110 will go high. The output of the zero-state time latch 110 will remain high until the zero-state time latch 110 is cleared by the END CYCLE signal. The output of the zero-state time latch 110 is supplied to the negative transition gate 115.

The negative transition gate 115 generally produces an output which indicates whether the first, second, and third criteria have been met in the case of a transition from one to zero. More specifically, the negative transition gate 115 receives signals from the output of the zero-state gate 113, the output of the zero-state time latch 110, the TEST signal, and an inverted output from the prior state memory 108. The negative transition gate 115 is a four-input NAND gate. Satisfaction of the first criteria is tested with the output of the zero-state gate 113 as well as the TEST signal. Satisfaction of the second criteria is tested with the output of zero-state time latch 110 as well as the TEST signal. Satisfaction of the third criteria is tested with the inverted output of the prior state memory 108. If all the input signals to the negative transition gate 114 are high, this indicates that all three criteria are satisfied, and the output-of the negative transition gate 114 will go low. The output of the negative transition gate 114 is provided to the valid transition gate 116 and the prior state memory 108.

The prior state memory 108 generally stores a new state subsequent to a valid transition. If a valid transition from 0 to 1 is detected, the prior state memory 108 stores a one-state. If a valid transition from 1 to 0 is detected, the prior state memory 108 stores a zero-state. More specifically, the prior state memory 108 receives the output of the positive transition gate 114 and the output of the negative transition gate 115, and produces the output signal and the inverted output signal. The prior state memory 108 is a preset/clear flip flop with an output and an inverted output. The clear input of the prior state memory 108 is connected to the output of the positive transition gate 114 and the preset input of the prior state memory is connected to the output of the negative transition gate 115, receives a clear signal from the gate 114 and a preset signal from the gate 115. The prior state memory 108 provides its output to the gate 114 and provides its inverted output to the gate 115. If the output of positive transition gate 114 goes low, the prior state memory 108 is cleared, causing its output to go low and its inverted output to go high. If the output of the negative transition gate goes low, the prior state memory 108 is preset, causing its output to go high and its inverted output to go low. The output of the prior state memory 108 is provided to the positive transition gate 114. The inverted output of the prior state memory 108 is provided to the negative transition gate 115.

The valid transition gate 116 generally produces an output that indicates that a valid transition was detected. More specifically, the valid transition gate 116 receives the output of the positive transition gate 114 and the output of the negative transition gate 115, and produces the VALID TRANS signal. The valid transition gate 116 is a two-input AND gate. The inputs are connected to the output of the positive transition gate 114 and the output of the negative transition gate 115. The output of the valid transition gate 116 is connected to the VALID TRANS signal. Normally, the VALID TRANS signal is high. However, if a valid transition from zero to one is detected, the output of the positive transition gate 114 goes low, causing the VALID TRANS signal to go low. If a valid transition from one to zero is detected, the output of the negative transition gate 115 goes low, causing the VALID TRANS signal to go low. The VALID TRANS signal is provided to the quadrant detector 42.

In operation, the transition filter and detector 40 waits for a positive transition on the unsynchronized data signal or the inverted unsynchronized data signal. If either the positive edge detector 101 or the negative edge detector 102 detects a positive transition, the edge detect gate will produce a negative pulse on the START CYCLE signal. The negative pulse on the START CYCLE signal causes the cycle control latch 103 to set the CYCLE ON signal high. When the CYCLE ON signal is high, subsequent transitions on the unsynchronized data signal and the inverted unsynchronized data signal are ignored.

Upon the CYCLE ON signal going high, the cycle time counter 105 begins counting to 16. Additionally, one-state time counter 104 will count, but only when the unsynchronized data signal is high. If the one-state time counter 104 reaches the count of 12 before the CYCLE ON signal goes low, the output of the one-state time latch 109 will go high. Similarly, the zero-state time counter 106 will count, but only when the inverted unsynchronized data signal is high. If the zero-state time counter 106 reaches the count of 12 before the CYCLE ON signal goes low, the output of the zero-state time latch 110 will go high.

When the cycle time counter 105 reaches the count 16, the cycle reset flip flop 107 creates a positive pulse on the TEST signal, initiating the test of whether all three criteria for a valid transition have been met. For a transition from zero-state to one-state, the first criteria is met if the output of one-state gate 112 is high when the TEST signal is high. The second criteria is met if the output of one-state latch 109 is high when the TEST signal is high. The third criteria is,met if the output of the prior state memory is high. If all three criteria are met, the valid transition gate 116 produces a negative pulse on the VALID TRANS signal, and a one-state is stored in the prior state memory 108. If any of the three criteria are not met, the VALID TRANS signal remains high, and the prior state memory 108 remains unchanged.

For a transition from one-state to zero-state, the first criteria is met if the output of zero-state gate 113 is high when the TEST signal is high. The second criteria is met if the output of zero-state latch 110 is high when the TEST signal is high. The third criteria is met if the inverted output of the prior state memory is high. If all three criteria are met, the valid transition gate 116 produces a negative pulse on the VALID TRANS signal, and a zero-state is stored in the prior state memory 108. If any of the three criteria are not met, the VALID TRANS signal remains high, and the prior state memory 108 remains unchanged.

Additionally, when the cycle time counter 105 reaches the count 16, the cycle reset flip flop 107 produces a negative pulse on the END CYCLE signal. This negative pulse on the END CYCLE signal resets the transition filter and detector 40. Subsequent to this reset, the transition filter and detector 40 waits for a new positive transition on either the unsynchronized data signal or the inverted unsynchronized data signal.

Figure 8:
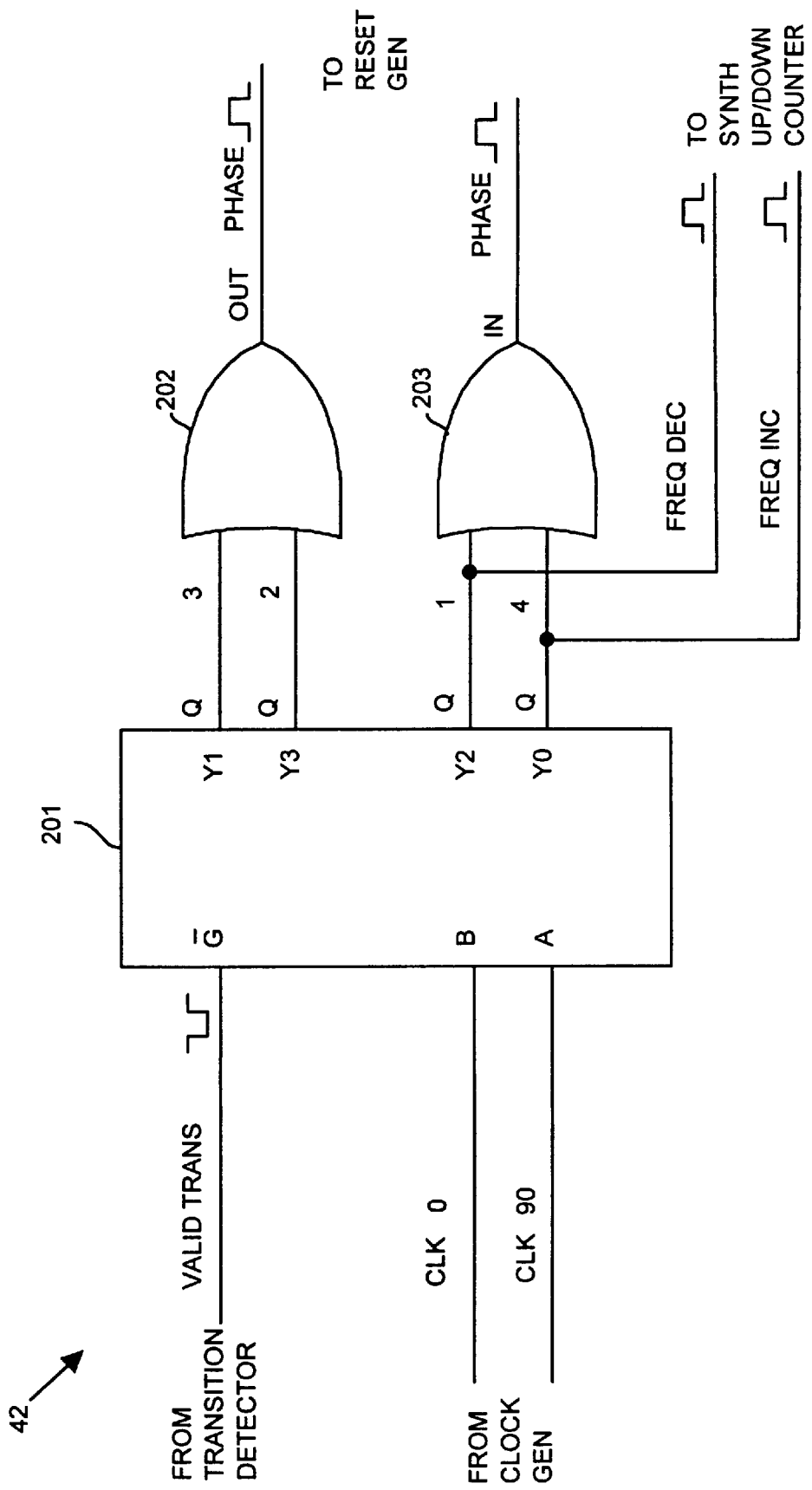
FIG. 8 is a detailed block diagram of the quadrant detector shown in FIG. 2.

FIG. 8 illustrates the quadrant detector 42. Generally, the quadrant detector 42 indicates, upon detection of a valid transition, whether the derived bit clock is in phase or out of phase. Additionally, if the derived bit clock is in phase, the quadrant detector 42, upon detection of a valid transition, indicates whether the bit clock frequency should be increased or decreased. More specifically, the quadrant detector 42, upon detection of a valid transition, determines in which quadrant of the bit clock the valid transition occurred.

Figure 9:
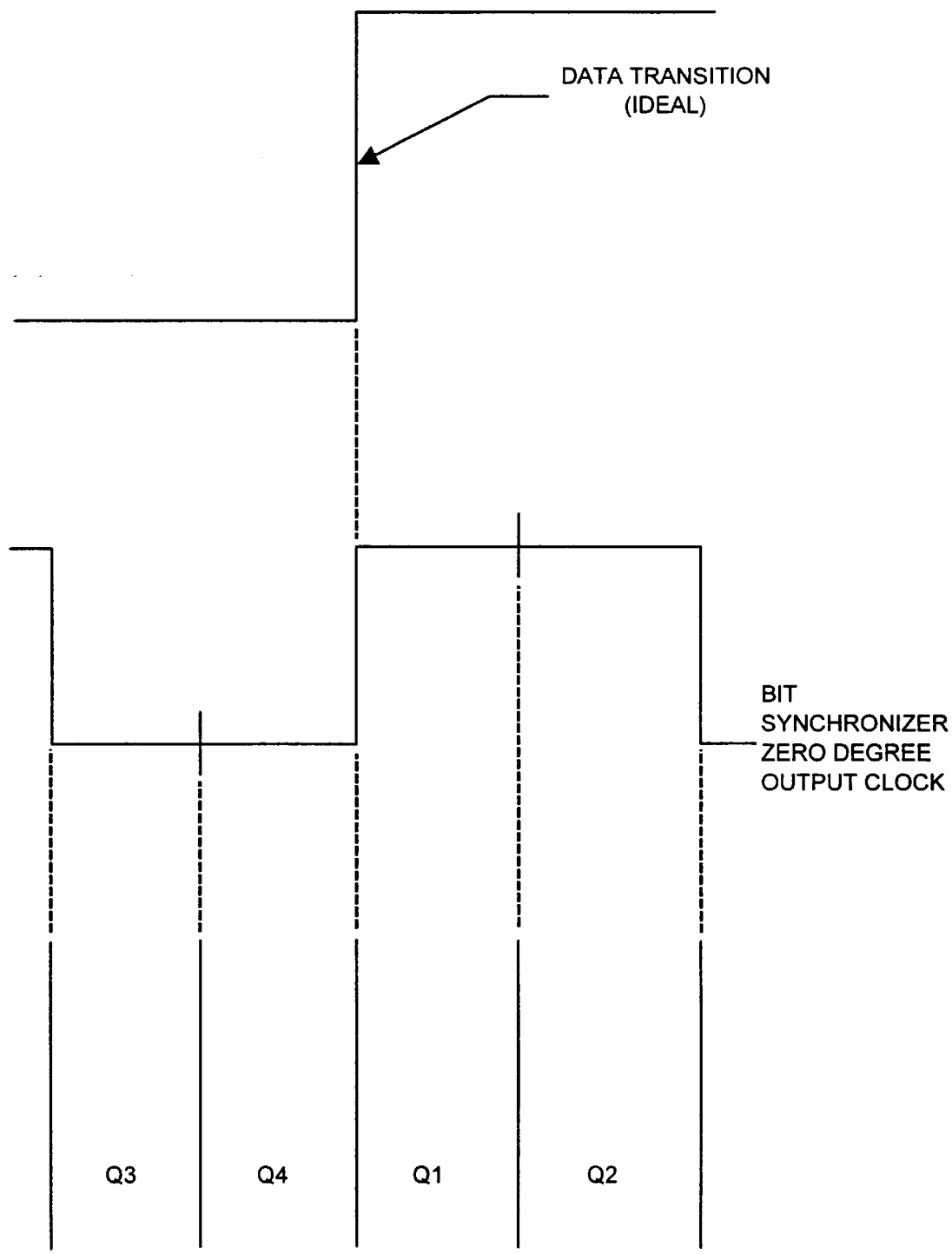
FIG. 9 is a timing diagram showing the definition of phase tracking and frequency tracking with respect to the zero degree derived bit clock.

FIG. 9 illustrates the quadrants in which a valid transition may occur in relation to the derived bit clock. If the derived bit clock were perfectly synchronized with the transmit bit clock, the valid transition would occur on the boundary between quadrants Q1 and Q4. If the valid transition falls within quadrants Q2 or Q3, the derived bit clock is considered out of phase with the transmit bit clock. If the valid transition falls within quadrants Q1 or Q4, the derived bit clock is considered in phase with the transmit bit clock. Additionally, if the valid transition falls within quadrant Q1, the frequency of the derived bit clock should be decreased. If the valid transition falls within quadrant Q4, the frequency of the derived bit clock should be increased.

Figure 10:
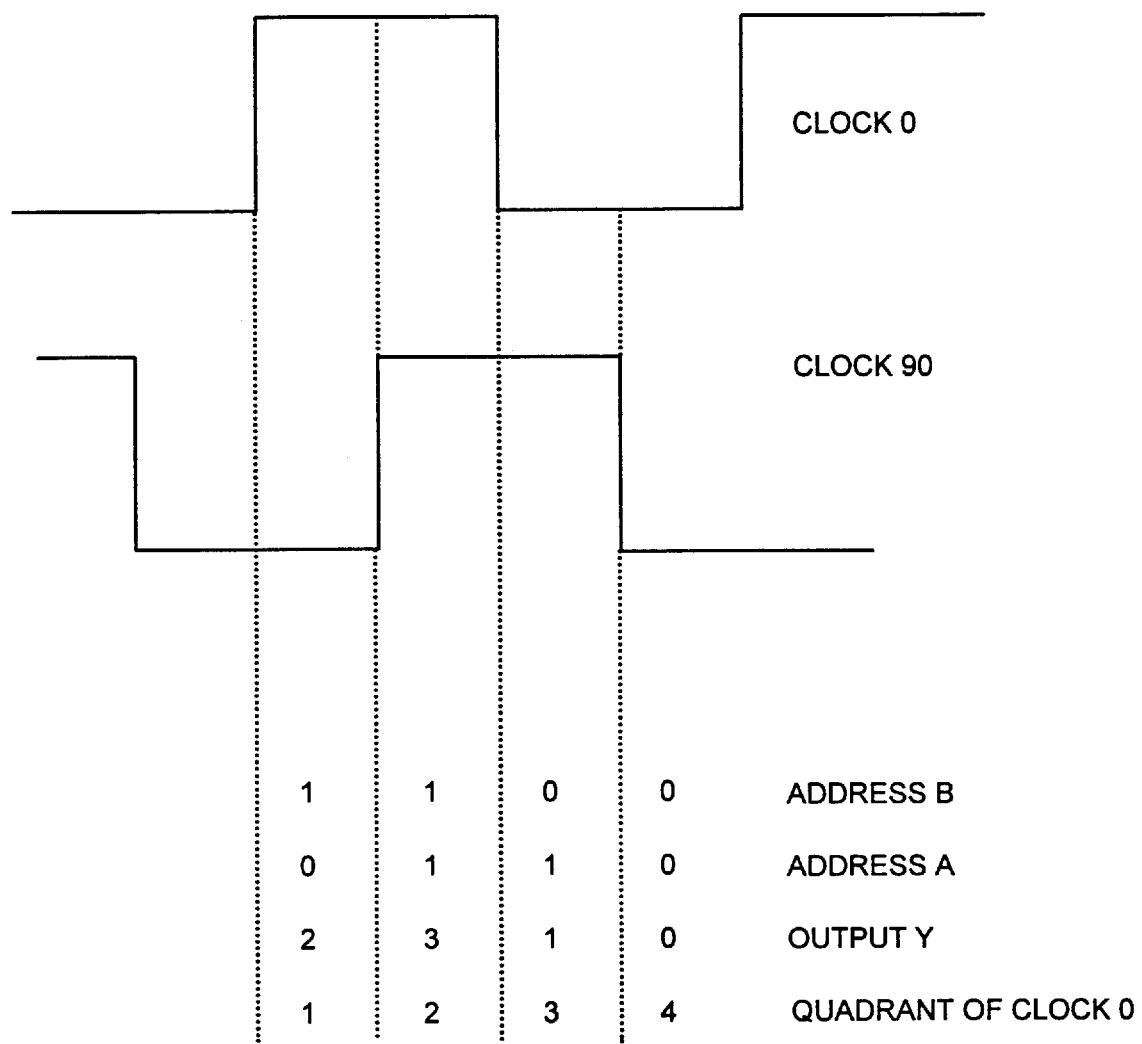
FIG. 10 is a timing diagram illustrating how the zero and ninety degree clocks drive a demultiplexer so that it acts as a time-domain sampler.

Referring FIGS. 2 and 8, the quadrant detector 42 generally receives the VALID TRANS signal from the transition filter and detector 40, as well as the CLK 0 and CLK 90 signals from the clock generator 38, and generates the output signals OUT PHASE, IN PHASE, FREQ DEC, and FREQ1 NC. The quadrant detector 42 comprises demultiplexer 201, and OR gates 202 and 203. The demultiplexer 201 is a one-to-four inverting demultiplexer. The CLK 0 signal is the derived bit clock and CLK 90 signal is the derived bit clock delayed by 90 degrees. The CLK 0 and CLK 90 signals are supplied to the address inputs of the demultiplexer 201, which causes each of four outputs, Y0, Y1, Y2, and Y3, to be selected in a cyclical fashion every period of the derived bit clock. FIG. 10 illustrates the sequence of outputs selected during one period of the derived bit clock, as well as the correspondence between quadrants of the derived bit clock and the selected outputs.

Referring again to FIG. 8, the VALID TRANS signal supplies the input to the demultiplexer 201. Thus, when a negative pulse occurs on the valid transition signal, a positive pulse is generated on the output then currently selected. Gate 202 receives the outputs of the demultiplexer 201 corresponding to quadrants Q2 and Q3, and generates the OUT PHASE signal. Gate 203 receives the outputs of the demultiplexer 201 corresponding to quadrants Q1 and Q4, and generates the IN PHASE signal. The output of the demultiplexer 201 corresponding to Q1 is supplied to the up/down counter 46 as the FREQ DEC signal. Additionally, the output of the demultiplexer 201 corresponding to Q4 is supplied to the up/down counter 46 as the FREQ1 NC signal. The IN PHASE and OUT PHASE signals are provided to the reset generator 44.

Figure 11:
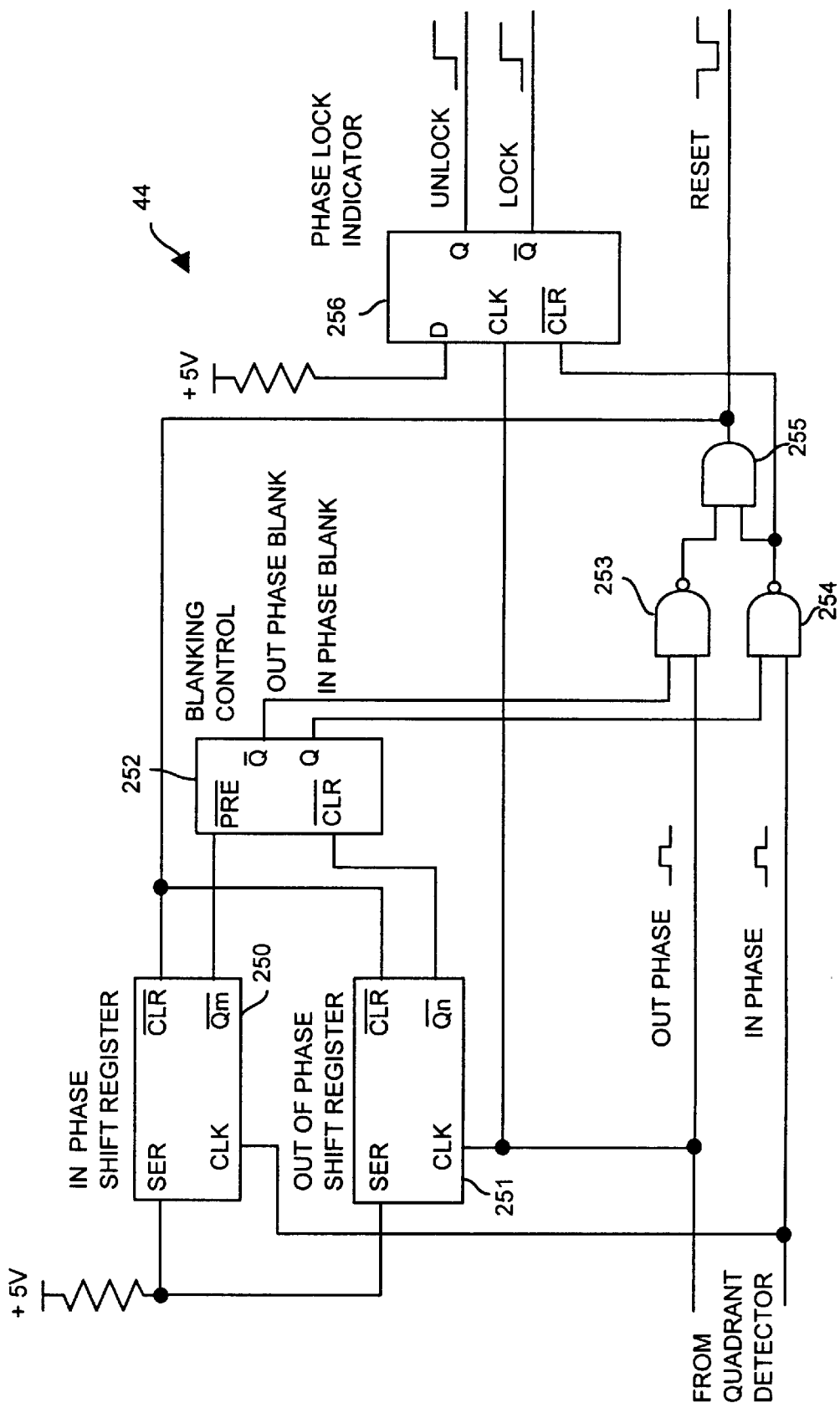
FIG. 11 is a detailed block diagram of the reset generator shown in FIG. 2.

FIG. 11 illustrates the reset generator 44. Generally, the reset generator 44 determines whether the bit synchronizer has become synchronized, or locked, and controls phase adjustments in the derived bit clock. Moreover, the reset generator generally controls the process of acquiring synchronization. More specifically, the reset generator 44 receives the OUT PHASE and IN PHASE signals from the quadrant detector 42, and generates the signals LOCK, UNLOCK, and RESET. The process of acquiring synchronization, as performed by the present invention, requires a number of data transitions. The number of transitions required depends on the state of the quadrant detector 42 and the frequency offset between the input data and the bit synchronizer clock generator 38. Unlike an analog phase locked loop, where transition density must be high to charge a filter in order to acquire synchronization, the present invention has no time constraints or transition density requirements for obtaining synchronization. Theoretically, the present invention could achieve synchronization over a period of minutes or hours.

The present invention has a range of transitions that it requires to lock. The best case lock would occur on a single transition. The probability of locking on a single transition is 0.002, which is derived from the product of the probability that the appropriate phase control blanking gate 253 or 254 is selected (probability=0.5), the probability that the quadrant detector 42 state is in quadrant one or four (probability= 0.5) and the size of a frequency step ($1/128$). Conversely, the present invention will not generally require more than 268 transitions to acquire synchronization. This number of transitions is determined as follows: 1) the maximum frequency offset requires 127 in phase transitions to correct (assuming that the quadrant detector is in quadrants 1 or 4); 2) the most adverse state of the clock phase control state machine requires 14 transitions to correct; and 3) assume that half of the transitions following the initial 14 transitions do not produce a frequency increment due to the fact that the quadrant detector is in quadrants 2 or 3. Given these worst case assumptions and assuming a 1 KHz data rate, the present invention will require 268 transitions to acquire synchronization. This number of transitions corresponds to 536 ms at a 50% transition density. At a lower transition density, for example, 0.002%, the present invention would require 137 seconds to acquire synchronization.

The reset generator 44 comprises an in phase shift register 250, an out of phase shift register 251, a blanking control flip flop 252, gates 253, 254, 255, and phase lock indicator flip flop 256. The in phase shift register 250 generally counts the number of transitions found to be in phase by the quadrant detector, and generates an output when an mth in phase transition is detected. In the present embodiment, m is chosen as 4, but the value of m may be adjusted depending on the application, as will be discussed below. More specifically, the in phase shift register 250 receives the IN PHASE signal and the RESET signal, and generates the $\overline{Qm}$ signal. The serial input of the in phase shift register 250 is tied to logic high, and the in phase shift register 250 is clocked by the IN PHASE signal. Therefore, after m=4 pulses appear on the IN PHASE signal, the $\overline{Qm}$ output goes low. The in phase shift register 250 is cleared by the RESET signal.

The out of phase shift register 251 generally counts the number of transitions found to be out of phase by the quadrant detector, and generates an output when an nth out of phase transition is detected. In the present embodiment, n is chosen as 8, but the value of n may be adjusted depending on the application, as will be discussed below. More specifically, the out of phase shift register 251 receives the OUT PHASE signal and the RESET signal, and generates the $\overline{Qn}$ signal. The serial input of the out of phase shift register 251 is tied to logic high, and the out of phase shift register 251 is clocked by the OUT PHASE signal. Therefore, after n=8 pulses appear on the OUT PHASE signal, the $\overline{Qn}$ output goes low. The out of phase shift register 251 is cleared by the DIVIDER RESET signal.

The blanking control flip flop 252 generally produces blanking signals corresponding to whether m=4 in phase transitions were detected or n=8 out of phase transitions were detected. The blanking control flip flop 252 receives the $\overline{Qm}$ signal from the in phase shift register 250, the out $\overline{Qn}$ signal from the out of phase shift register 251, and generates an OUT PHASE BLANK signal and an IN PHASE BLANK signal. If the $\overline{Qm}$ signal goes low, the blanking control flip flop 252 is preset, causing the IN PHASE BLANK signal to go high and the OUT PHASE BLANK signal to go low. If the $\overline{Qn}$ signal goes low, the blanking control flip flop 252 is cleared, causing the IN PHASE BLANK signal to go low and the OUT PHASE BLANK signal to go high.

The gates 253, 254, and 255 generally produce the RESET signal. Gate 253 receives the OUT PHASE signal and the OUT PHASE BLANK signal, and generates an output which is supplied to the gate 255. Gate 253 allows positive pulses on the OUT PHASE signal to appear, inverted, on its output only if the OUT PHASE BLANK signal is high. Gate 254 receives the IN PHASE signal and the IN PHASE BLANK signal, and generates an output which is supplied to the gate 255 as well as the phase lock indicator flip flop 256. Gate 254 allows positive pulses on the IN PHASE signal to appear, inverted, on its output only if the IN PHASE BLANK signal is high. Gate 255 receives the output from gate 253 and the output from gate 254, and generates the RESET signal. The RESET signal is normally high. However, if an OUT PHASE pulse occurs when the OUT PHASE BLANK signal is high, or if an IN PHASE pulse occurs when the IN PHASE BLANK signal is high, the RESET signal will go low, thereby resetting the divider 34 shown in FIG. 12.

The phase lock indicator flip flop 256 generally produces signals that indicate whether the bit synthesizer is synchronized. More specifically, the phase lock indicator flip flop 256 receives the OUT PHASE signal and the output from gate 254, and generates an UNLOCK signal and a LOCK signal. The phase lock indicator flip flop 256 is a D flip flop. The phase lock indicator flip flop 256 is clocked by the OUT OF PHASE signal and cleared by the output of the gate 254. The D input is tied to logic high. Therefore, if a pulse occurs on the IN PHASE signal when the IN PHASE BLANK signal is high, the LOCK signal will go high and the UNLOCK signal will go low. However, if a pulse occurs on the OUT PHASE signal, the LOCK signal will go low and the UNLOCK signal will go high. The LOCK and UNLOCK signals are supplied to the phase lock indicator 50. The RESET signal is supplied to the divider 34.

Figure 12:
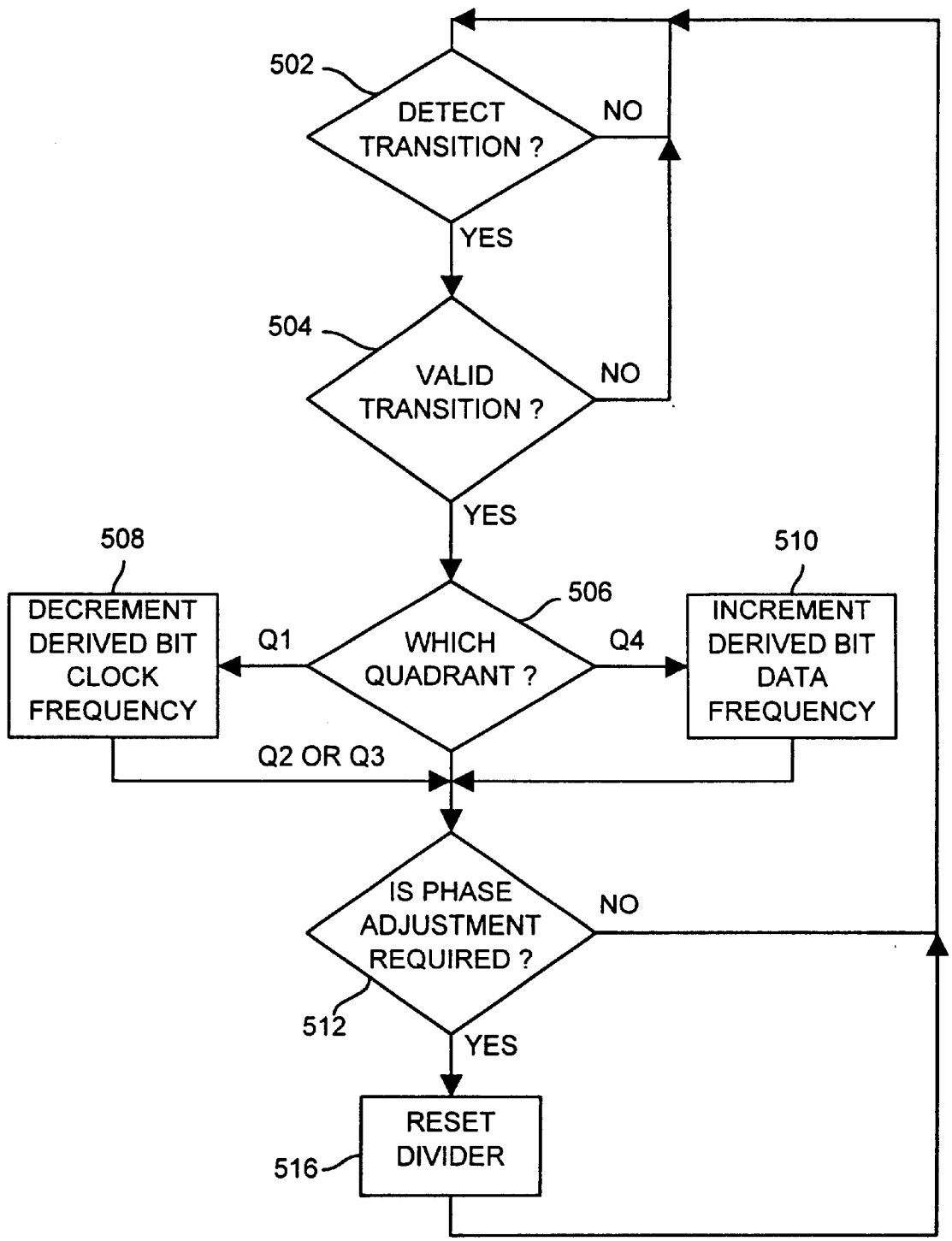
FIG. 12 is a flow diagram illustrating the function of the bit synchronizer shown in FIG. 1.

FIG. 12 illustrates the operation of the bit synchronizer. Blocks 502 and 504 generally indicate the function of the transition detector and filter 40. Block 502 detects transitions on the unsynchronized data signal and the inverted unsynchronized data signal. When a transition is detected, control transfers to block 504. Block 504 generally determines whether the detected transition was a valid transition. More specifically, block 504 tests whether the three criteria are met, as discussed previously. If the transition is valid, then control transfers to block 506. Otherwise, control transfers to block 502.

Block 506 generally indicates the function of the quadrant detector 42. Block 506 determines in which quadrant the transition occurred. If the transition occurred in quadrants Q2 or Q3, then control transfers to block 512. If the transition occurred in quadrant Q1, then control transfers to block 508. If the transition occurred in quadrant Q4, then control transfers to block 510.

Blocks 508 and 510 generally indicate the function of the oscillator 32, the divider 34, the decoder 36, and the up/down counter 46. Block 508 adjusts the frequency of the derived bit clock downward, and then transfers control to block 512. Block 510 adjusts the frequency of the derived bit clock upward, and then transfers control to block 512.

Block 512 generally indicates the function of the reset generator 44. Block 512 generally determines whether a phase adjustment to the derived bit clock is required. If a phase adjustment is required, control transfers to block 516. If a phase adjustment is not required, control returns to block 502.

Block 512 generally indicates the function of the divider 34 and the decoder 36. Block 516 generally resets the divider 34, thus completing a phase adjustment. Then, control returns to block 502.

As mentioned previously, several parameters in the present embodiment may be adjusted depending upon desired performance characteristics. Several performance measurements will be discussed, as well as the effect of the parameters of the present embodiment upon those performance measurements.

A flywheel time is a performance measurement which indicates the amount of time, without phase or frequency corrections, from when the derived bit clock is phase and frequency synchronized with the transmit bit clock, until the accumulated error, in the time domain, is sufficient to shift the derived bit clock 90 degrees with respect to the transmit bit clock. In the present embodiment, two contributors to time domain error are an initial frequency offset between the derived bit clock and the transmit bit clock, and frequency stability of the oscillator 32. In the following discussions, a transmit bit clock frequency of 1 kHz will be assumed. For a transmit bit clock frequency of 1 kHz, a shift of 90 degrees corresponds to a time delay of 250 microseconds. In the present embodiment, a transmit bit clock frequency of 1 kHz requires an oscillator 32 frequency of 40 MHZ.

The error due to initial frequency offset between the derived bit clock and the transmit bit clock will be calculated. Assuming the derived bit clock is synchronized in frequency with the transmit bit clock, the worst-case frequency offset corresponds to one step of the up/down counter 46. The frequency error due to one step is represented by equation 1:

$$\frac{1000 \text{ Hz}}{40000 \text{ steps}} = 0.025 \text{ Hz/step} \qquad \text{Equation 1}$$

Therefore, the error per bit due to initial frequency offset is represented by equation 2:

$$\left(\frac{1}{1000}\right) - \left(\frac{1}{1000.025}\right) = 2.50 \times 10^{-8} \frac{\text{sec}}{\text{bit}} \qquad \text{Equation 2}$$

Next, the error due to stability of the oscillator 32 is discussed. For a 40 MHZ oscillator, a typical peak to peak frequency offset is 10 Hz. Translated into the transmit clock frequency, the peak to peak clock frequency offset is represented by equation 3:

$$\frac{10 \text{ Hz}}{40000} = 0.00025 \text{ Hz} \qquad \text{Equation 3}$$

Therefore, the error per bit due to stability of the oscillator 32 is represented by equation 4:

$$\left(\frac{1}{1000}\right) - \left(\frac{1}{1000.00025}\right) = 2.50 \times 10^{-10} \frac{\text{sec}}{\text{bit}} \qquad \text{Equation 4}$$

Finally, the flywheel time will be calculated. Adding the error per bit due to initial frequency offset and the error due to stability of the oscillator 32, the total error per bit represented by equation 5:

$$2.50 \times 10^{-8} \frac{\text{sec}}{\text{bit}} + 2.50 \times 10^{-10} \frac{\text{sec}}{\text{bit}} = 2.525 \times 10^{-8} \frac{\text{sec}}{\text{bit}} \qquad \text{Equation 5}$$

Because a phase shift of 90 degrees corresponds to a delay of 250 microseconds, the flywheel time is represented by equation 6:

$$\frac{250 \times 10^{-6} \text{ sec}}{2.525 \ 10^{-8} \frac{\text{sec}}{\text{bit}}} = 9900 \text{ bits} \qquad \text{Equation 6}$$

The flywheel time and the oscillator 32 frequency are linearly related. Thus, if the oscillator 32 frequency is doubled to 80 MHz, then the frequency error due to one step becomes 0.0125 Hz, and the error per bit due to initial frequency offset accumulates at 12.5 nsec/bit, rather than 25 nsec/bit as with the 40 MHz oscillator 32. If the 80 MHz oscillator 32 had the same error per bit due to stability as in equation 4, the flywheel time would become 19608 bits for the example above. Therefore, by adjusting the frequency ratio of the oscillator 32 to the transmit clock, the required flywheel time is achieved.

A slew rate indicates the maximum rate of change in frequency of the derived bit clock that the bit synchronizer may achieve. As discussed previously, for a transmit clock rate of 1 kHz and an oscillator 32 of 40 MHZ, the change in frequency per transition is represented by equation 7:

$$\frac{1000 \text{ Hz}}{40000 \text{ steps}} \cdot \frac{1 \text{ step}}{\text{transition}} = \frac{0.025 \text{ Hz}}{\text{transision}} \quad \text{Equation 7}$$

The slew rate depends on the rate of transitions in the data signal, because a frequency adjustment can occur only when a transition occurs. Therefore, the maximum slew rate occurs when the data is alternating ones and zeros as shown in equation 8:

maximum slew rate = Equation 8

$$\left(500 \frac{\text{transitions}}{\text{sec}}\right)\left(\frac{0.025 \text{ Hz}}{\text{transition}}\right) = \frac{12.5 \text{ Hz}}{\text{sec}}$$

The minimum slew rate for a barker code (4 transitions per 2048 bits) is represented by equation 9:

minimum slew rate (Barker code) = Equation 9

$$\left(\frac{4 \text{ transitions}}{2.048 \text{ sec}}\right)\left(\frac{0.025 \text{ Hz}}{\text{transition}}\right) = \frac{0.049 \text{ Hz}}{\text{sec}}$$

As mentioned previously, the logic 62 in the up/down counter 46 may be designed to increment or decrement the 8-bit counter 60 by more than one bit at a time. By increasing the size of the increment, the slew rate of the bit synchronizer may be increased. For example, if the logic 62 is designed to increment or decrement the 8-bit counter 60 by two counts for every pulse on the FREQ1 NC signal or FREQ DEC signal, respectively, the change in frequency per transition becomes 0.05 Hz, rather than 0.025 Hz. Thus, the slew rate of the bit synchronizer is effectively doubled.

A tuning range defines the range of frequencies of the transmit bit clock to which the bit synchronizer can synchronize. The tuning range is substantially defined by the range of counts provided by the up/down counter 46. In the present embodiment, the up/down counter comprised an 8-bit counter 60. The decoder 36 modifies the 16-bit count of the divider 34 with the 8-bit count of the up/down counter, effectively providing a range of counts from 39,936 to 40,063 (128 steps). This defines a tuning range represented by equation 10:

$$\text{Mimimum frequency} = 1000 \text{ Hz} \cdot \frac{40,000}{40,063} = 998.4 \text{ Hz} \quad \text{Equation 10}$$

$$\text{maximum frequency} = 1000 \text{ Hz} \cdot \frac{40,000}{39,936} = 1001.6 \text{ Hz}$$

However, by modifying the up/down counter 46 and the decoder 36, a larger or smaller tuning may be achieved. For example, by increasing the 8-bit counter 60 to a 9-bit binary synchronous counter, and by modifying the decoder 36, a larger tuning range is achieved. This effectively provides a range of counts from 39,872 to 40,127 (256 steps), and a tuning range represented by equation 11:

$$\text{Mimimum frequency} = 1000 \text{ Hz} \cdot \frac{40,000}{40,127} = 996.8 \text{ Hz} \quad \text{Equation 11}$$

$$\text{maximum frequency} = 1000 \text{ Hz} \cdot \frac{40,000}{39,872} = 1003.2 \text{ Hz}$$

Figure 13:
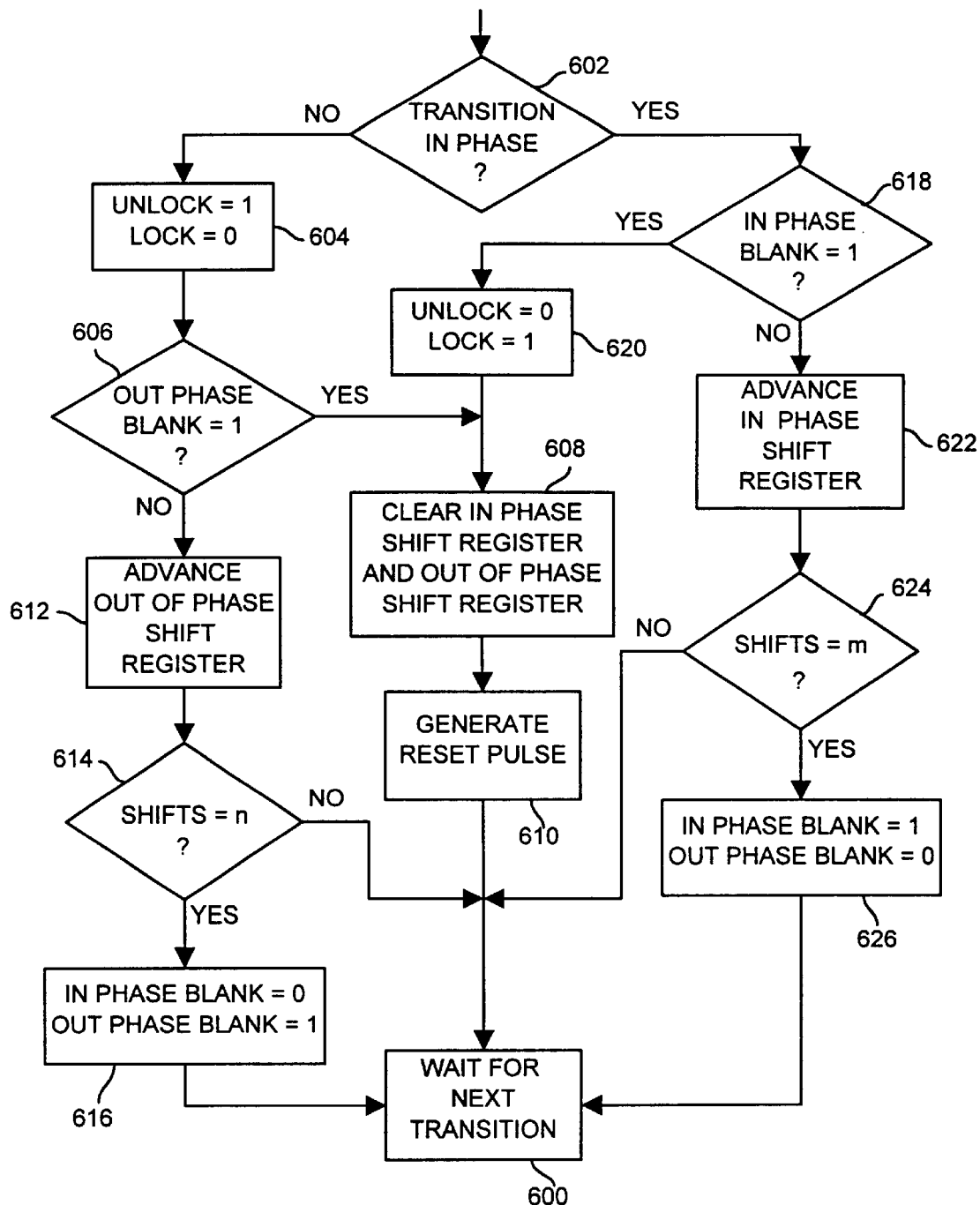
FIG. 13 is a flow diagram illustrating the function of the reset generator shown in FIG. 2.

FIG. 13 is a flow chart that illustrates the operation of the reset generator 44. Block 602 generally waits for either an in phase transition or an out of phase transition, as indicated by pulses on the IN PHASE signal or the OUT PHASE signal, respectively. If the transition is out of phase, control transfers to block 604. If the transition is in phase, control transfers to block 618.

When control transfers to block 604, the reset generator 44 sets the UNLOCK signal high and sets the LOCK signal low. Then control transfers to block 606. Block 606 generally indicates that if the OUT PHASE BLANK signal was previously high, then control will transfer to block 608. Otherwise, control will transfer to block 612.

If control transfers to block 608, the in phase shift register 250 and the out of phase shift register 251 are cleared. Then control transfers to block 610, wherein a pulse on the RESET signal is generated. Next, control transfers to block 600, wherein the reset generator resumes waiting for an in phase transition or an out of phase transition.

If control transfers to block 612, the out of phase shift register 251 is advanced by one shift. Then control transfers to block 614. Block 614 tests whether the number of shifts of the out of phase shift register 251 is equal to n. If the number of shifts is equal to n, then control transfers to block 611. Otherwise, control transfers to block 600. Block 616 sets the IN PHASE BLANK signal low and the OUT PHASE BLANK signal high, and then transfers control to block 600.

If an in-phase transition occurred, control will transfer to block 618. Block 618 tests whether the IN PHASE BLANK signal was previously high. If the IN PHASE BLANK signal was previously high, control transfers to block 620. Otherwise, control transfers to block 622. Block 620 generally sets the UNLOCK signal low and the LOCK signal high, and then transfers control to block 608.

Block 622 generally advances the in phase shift register 250 by one shift, and then transfers control to block 624. Block 624 tests whether the number of shifts of the in phase shift register 250 is equal to m. If the number of shifts is equal to m, then control transfers to block 626. Otherwise, control transfers to block 600. Block 626 sets the IN PHASE BLANK signal high and sets the OUT PHASE BLANK signal low, and then transfers control to block 600.

What is claimed is:

1. A bit recovery subsystem for synchronizing a received digital signal with a transmitted digital signal, comprising:
   a demodulator adapted to receive an RF signal encoded with digital information representative of a transmit bit clock and to produce a baseband signal;
   voltage comparators adapted to process the baseband signal to produce two digital logic signals;
   a latch adapted to convert the two digital logic signals into unsynchronized data and inverted unsynchronized data each having a first state and a second state;
   a bit synchronizer adapted to process the unsynchronized data and the inverted unsynchronized data to produce a derived bit clock; and
   a reclock latch adapted to process the unsynchronized data and the derived bit clock delayed by a phase to produce synchronized data.

2. The bit recovery subsystem of claim 1, wherein the latch comprises an S-R latch.

3. The bit recovery subsystem of claim 1, wherein the bit synchronizer comprises:

an oscillator;

a decoder adapted to generate first, second, and third clock signals based on the oscillator;

a transition filter and detector adapted to receive and process the first clock signal, the unsynchronized data and the inverted unsynchronized data to produce an indication that a valid data transition between a first state and a second state has occurred in the unsynchronized data;

a quadrant detector adapted to receive the indication and to generate an output in the unsynchronized data; and a clock generator adapted to receive the second and third clock signals from the decoder and to generate the derived bit clock.

4. The bit recovery subsystem of claim 3, wherein the decoder comprises a direct digital synthesizer.

5. The bit recovery subsystem of claim 3, wherein the transition filter and detector is adapted to apply a plurality of criteria to the unsynchronized data to determine if a valid transition has occurred in the unsynchronized data.

6. The bit recovery subsystem of claim 5, wherein a first criterion of the plurality of criteria comprises the unsynchronized data remaining in the second state for a first period of time after the unsynchronized data changed to the second state.

7. The bit recovery subsystem of claim 6, wherein a second criterion of the plurality of criteria comprises the unsynchronized data remaining in the second state for an aggregate period of time after the unsynchronized data changed to the second state.

8. The bit recovery subsystem of claim 7, wherein the third criterion of the plurality of criteria comprises a condition that the second state is different from a previously-stored state.

9. The bit recovery subsystem of claim 3, wherein the bit synchronizer further comprises an up/down counter that receives the output from the quadrant detector and generates an output signal that controls the first, second and third clock signals generated by the decoder.

10. The bit recovery subsystem of claim 9, wherein the bit synchronizer further comprises a frequency indicator that displays a frequency at which the derived bit clock is oscillating.

11. The bit recovery subsystem of claim 3, further comprising a reset generator that generates lock and unlock signals.

12. The bit recovery subsystem of claim 11, further comprising a phase lock indicator receiving the lock and unlock signals from the reset generator and providing a visual indication of whether the quadrant detector is locked.

13. A method of synchronizing a received digital signal with a transmitted digital signal, comprising the steps of:

receiving an RF signal encoded with digital information representative of a transmit bit clock and producing a baseband signal;

processing the baseband signal to produce two digital logic signals;

converting the two digital logic signals into unsynchronized data and inverted unsynchronized data;

processing the unsynchronized data and inverted unsynchronized data to produce a derived bit clock; and processing the unsynchronized data and the derived bit clock to produce synchronized data;

wherein the step of processing the unsynchronized data and inverted unsynchronized data to produce a derived bit clock comprises the steps of:

generating first, second and third clock signals based on an oscillator signal;

processing the first clock signal, the unsynchronized data and the inverted unsynchronized data to produce an indication that a valid data transition has occurred in the unsynchronized data;

generating an output that controls the first, second and third clock signals to maintain valid data transitions in the unsynchronized data; and generating the derived bit clock from the second and third clock signals.

14. The method of claim 13, wherein the step of processing the first clock signal, the synchronized data and the inverted unsynchronized data comprises an application of a plurality of criteria to the unsynchronized data to determine if a valid transition has occurred in the unsynchronized data.

15. The method of claim 14, wherein a first criterion of the plurality of criteria comprises the unsynchronized data remaining in the second state for a first period of time after the unsynchronized data changed to the second state.

16. The method of claim 15, wherein a second criterion of the plurality of criteria comprises the unsynchronized data remaining in the second state for an aggregate period of time after the unsynchronized data changed to the second state.

17. The method of claim 16, wherein a third criterion of the plurality of criteria comprises a condition that the second state is different from a previously-stored state.

18. The method of claim 13, further comprising the step of generating an output signal that controls the first, second and third clock signals.

19. The method of claim 18, further comprising the step of displaying a frequency at which the derived bit clock is oscillating.

20. The method of claim 13, further comprising the step of generating lock and unlock signals.

21. A device for producing a reset signal used in acquiring synchronization between a received signal and a transmitted signal based on an in phase signal and an out of phase signal, comprising:

a first shift register adapted to be clocked by the in phase signal, the first shift register adapted to generate a first output signal after the first shift register has been clocked a first number of times;

a second shift register adapted to be clocked by the out of phase signal, the second shift register adapted to generate a second output signal after the second shift register has been clocked a second number of times;

a blanking control adapted to receive the first output signal and the second output signal and to generate a control signal based on the first output signal and the second output signal; and a reset circuit adapted to receive the in phase signal and the out of phase signal and the control signal and to output one of the in phase signal and the out of phase signal as the reset signal based on the control signal.

22. The device of claim 21, where in the first number of times is less than the second number of times.

23. The device of claim 21, wherein the first number of times comprises four times.

24. The device of claim 21, wherein the second number of times comprises eight times.

25. The device of claim 21, wherein the blanking control comprises a flip-flop.

26. The device of claim 21, wherein the reset signal is indicative of a valid data edge.

27. The device of claim 21, wherein the in phase signal and the out of phase signal are generated by a quadrant detector.

28. The device of claim 21, wherein the reset circuit comprises NAND gates that are enabled by the control signal.

* * * * *